US006215374B1

(12) United States Patent
Petrovic

(10) Patent No.: US 6,215,374 B1
(45) Date of Patent: Apr. 10, 2001

(54) MAGNETICALLY COUPLED RESONATORS FOR ACHIEVING LOW COST NARROW BAND PASS FILTERS HAVING HIGH SELECTIVITY, LOW INSERTION LOSS AND IMPROVED OUT-OF-BAND REJECTION

(75) Inventor: Branislav A. Petrovic, La Jolla, CA (US)

(73) Assignee: Broadband Innovations, Inc., San Diego, CA (US)

( * ) Notice: Subject to any disclaimer, the term of this patent is extended or adjusted under 35 U.S.C. 154(b) by 0 days.

(21) Appl. No.: 09/039,988

(22) Filed: Mar. 16, 1998

(51) Int. Cl.$^7$ .................................................. H03H 7/09
(52) U.S. Cl. ............................................ 333/177; 333/204
(58) Field of Search .................................. 333/177, 203, 333/204, 205

(56) References Cited

U.S. PATENT DOCUMENTS

| 4,214,212 | 7/1980 | Dipetromaria . | |
|---|---|---|---|
| 4,451,804 | 5/1984 | Veisz et al. | 333/177 |
| 4,601,062 | 7/1986 | Hettiger | 333/176 X |
| 4,614,925 | 9/1986 | Kane | 333/174 |
| 4,619,000 | 10/1986 | Ma | 455/340 X |
| 4,754,242 | 6/1988 | Okamura et al. | 333/175 |
| 4,888,568 | 12/1989 | Kawaguchi | 333/174 |
| 4,894,629 | 1/1990 | Okamura et al. | 333/177 |
| 5,066,932 | 11/1991 | Takada et al. | 333/202 |
| 5,144,268 | 9/1992 | Weidman | 333/204 |
| 5,343,176 | * 8/1994 | Hasler | 333/204 |
| 5,376,907 | 12/1994 | Duflot et al. | 333/174 |
| 5,400,000 | 3/1995 | Okamura et al. | 333/175 |

FOREIGN PATENT DOCUMENTS

| 445245 | * 6/1927 | (DE) | 333/177 |
|---|---|---|---|
| 2054581 | * 9/1977 | (DE) | 333/177 |
| 59-126301 | * 7/1984 | (JP) | 333/204 |
| 62-43901 | * 2/1987 | (JP) | 333/204 |
| 94/25996 | * 11/1994 | (WO) | 333/204 |

OTHER PUBLICATIONS

Kuo, Franklin F.; Network Analysis and Synthesis; 1962, 1966; pp. 238–44; John Wiley & Sons, Inc.
The Radio Amateur's Handbook; 1983; pp. 2–33 to 2–50, 3–1 to 7; 60th Edition, American Radio Relay League, Newington, CT 06111.
Zverev, Anatol I.; Handbook of Filter Synthesis; 1967; pp. 499–513; John Wiley & Sons, Inc.
Toko Coils and Filters 1996 Product Catalog; p. 9, 154–155; Toko America, Inc.; 2480 N. First Street, Suite 260, San Jose, CA 95131.

* cited by examiner

Primary Examiner—Justin P. Bettendorf
(74) Attorney, Agent, or Firm—Skjerven Morrill MacPherson, LLP; Robert C. Strawbrich

(57) ABSTRACT

Parallel and series tuned resonator circuit topologies are disclosed that permit implementation of narrow band-pass filters having high loaded Q and optimal coupling (for low insertion loss) at frequencies in approximately the 50 MHz to 1 GHz. The topologies employ an additional series capacitor for the parallel-tuned topology, and an additional series capacitor for the series-tuned topology, the capacitors having values counterintuitive to those of skill in the art to produce $6^{th}$ order transfer functions out of what were once lower order resonators. Multistrip transmission lines are exploited in the parallel-tuned circuit to reduce the inductance of the resonators to achieve a very large skew in the ratios of inductance to capacitance, to increase Q while maintaining optimal coupling between the resonators of the tuned resonator circuits. Air coils are used in the series-tuned topology to achieve the large inductor values desirable for this topology.

18 Claims, 26 Drawing Sheets

*400 MHz BP Filter*

$S_1 = S_2 = S_4 = S_5 = 3.45$ mm
$S_3 = 3$ mm

400 MHz Band Pass Filter
(Example #7)

$S_1 = S_2 = 5.5mm$

EQUIVALENT INDUCTANCE OF MICRO-STRIP TRANSMISSION LINES USED IN EXAMPLE FILTERS:

DIELECTRIC CONSTANT = 4.65; HEIGHT = 1.5 MM; COPPER THICKNESS: 0.018 MM

| FILTER EXAMPLE # | FILTER CENTER FREQUENCY (MHZ) | LENGTH OF USTRIP LINE (MM) | WIDTH OF USTRIP LINE (MM) | PERCENTAGE OF WAVE-LENGTH (%) | EQUIVALENT INDUCTANCE OF USTRIP LINE (nH) |
|---|---|---|---|---|---|
| 4 | 70 | 12.25 | 1.5 | 0.6 | 6.1 |
| 5 | 400 | 4 | 1 | 1.1 | 2.4 |
| 6 | 800 | 3.9 | 3 | 2.3 | 1.3 |
| 7 | 400 | 5.35 | 3 | 1.5 | 1.8 |
| 8 (MULTIPLE MICROSTRIP LINES CONNECTED IN PARALLEL) | 400 | 5.5 | 3 LINES CONNECTED IN PARALLEL, EACH 2 MM WIDE | 1.6 | (2.4 nH EACH) 0.72 nH TOTAL (SEE NOTE) |
| 9 | 400 | 29.4 | 2 | 8.5 | 14 |
| 10 (MULTIPLE MICROSTRIP LINES CONNECTED IN PARALLEL) | 400 | 5.5 | 3 LINES CONNECTED IN PARALLEL, EACH 2 MM WIDE | 1.6 | (2.4 nH EACH) 0.72 nH TOTAL (SEE NOTE) |

NOTE: ADDING MORE MICROSTRIP LINES CONNECTED IN PARALLEL (MULTISTRIP LINES), VERY LOW INDUCTANCE VALUES, IN THE ORDER OF 0.5 nH, OF HIGH ACCURACY AND REPEATABILITY ARE ACHIEVABLE. CONSIDERING THE ACHIEVABLE TOLERANCES IN MANUFACTURING (LENGTH AND WIDTH OF THE LINES), A TOLERANCE OF +/- 2% OF THE INDUCTANCE VALUE OF THE MULTISTRIP LINES IS POSSIBLE.

FIG. 30

MAGNETICALLY COUPLED RESONATORS FOR ACHIEVING LOW COST NARROW BAND PASS FILTERS HAVING HIGH SELECTIVITY, LOW INSERTION LOSS AND IMPROVED OUT-OF-BAND REJECTION

BACKGROUND OF THE INVENTION

1. Field of the Invention

This invention relates to magnetically coupled resonators, and more particularly to their use as narrow band filters having a high-loaded Q (quality factor) for increased selectivity, low insertion loss and improved out-of-band rejection for advantageous application in high frequency (HF), very high frequency (VHF) and ultra high frequency (UHF) bands, but which are simple and inexpensive to manufacture with a high degree of repeatable accuracy.

2. Background of the Related Art

The processing of broadband multi-carrier signals presents a particularly rigorous and stringent context for signal processing circuitry such as filters. The base-band television signal for example, which has a bandwidth on the order of about 5–6 MHz, is typically mixed with (to modulate) an RF (radio frequency) carrier signal in the range of 50 to 1000 MHz or greater, to achieve frequency division multiplexing (FDM). Applications which require the processing of broadband signals such as the broadcast and reception of television signals can present situations which require filters to pass only a small fraction of the total bandwidth (those frequencies fall within the pass band), while rejecting the rest of the frequencies over the total bandwidth (those falling within the stop-band). This is accomplished using a narrow band-pass filter.

Noise and image signals, as well as various undesired spurious signals, can be injected or generated at various points in processing, and thus band-pass filters are often called upon to reject (i.e. attenuate) out-of-band signals to significantly low levels, depending upon the sensitivity of the application. For example, even signals attenuated up to 60 dB can still be seen in received video transmissions. Thus, it is often critically important that any signals present other than the base-band signal modulated on the desired carrier be sufficiently attenuated. This often requires band-pass filters to be very selective (i.e. ideally passing only that fraction of the total bandwidth that contains the base-band signal of interest), with little or no loss of energy in the pass-band (i.e. low insertion loss), while meeting and maintaining the requisite measure of attenuation for all other frequencies in the stop-band. Moreover, because the fraction of the total bandwidth occupied by base band signals in broadband applications are so small relatively speaking (on the order of 1–2%), such filters must produce the requisite frequency response with a high degree of accuracy and must maintain that response over time (i.e. the response should not drift). Further, they must be relatively immune to RF noise from external sources, as well as from coupling between their own components. Finally, it is always desirable that the filters be inexpensive, and easy to manufacture with a high degree of repeatable accuracy.

There are several known techniques for implementing band-pass filters. As previously discussed, the Q value of a filter indicates its selectivity; a filter's selectivity is defined by how quickly the filter's response transitions from the pass band to the stop band. The higher the Q of a filter, the steeper the roll-off from pass band frequencies to stop band frequencies. Because the input and output loading of a filter affects its Q, a more useful and practical measure is its "in-circuit" or loaded Q (i.e. $Q_L$). The $Q_L$ of a filter is roughly equal to the reciprocal of the fractional bandwidth of its frequency response, which is typically measured between the points on the response curve that are 3 dB below the peak of the response (i.e. the half-power points of the response). Thus, the $Q_L$ of a filter passing a 1-% fractional bandwidth is roughly 100. Narrow pass band filters for broadband signal processing applications often require a high value of $Q_L$ while exhibiting low insertion loss (i.e. the amplitude of signals in the pass band should not be significantly attenuated), and attenuation off signals in the stop-band should meet the requirements of the applications.

One known technique for implementing band-pass filters involves the use of lumped LC components to produce classical filters based on the technique of low-pass to band-pass transformation. Several variations of topologies can be synthesized for producing desired band-pass filter responses. The shortcomings of such filters are numerous for purposes of processing broadband signals in the VHF and UHF bands, the most serious of which is that the lumped components (particularly the coil inductors) are highly susceptible to parasitic effects at frequencies much above 100 MHz. Moreover, several stages of circuit components must be cascaded together to achieve the complexity of transfer function requisite for a high value of $Q_L$. Thus, such filters take up valuable space and make their cost of manufacture relatively high.

Another known technique for implementing filters employs helical resonators. Filters employing helical resonators are magnetically and/or capacitively coupled and are capable of producing a response with the high $Q_L$ and low insertion loss requisite for many broadband signal-processing applications. They are not, however, suitable for frequencies much below 150 MHz, because very large inductor values would be required for the resonators below that frequency. Such inductors are impractical or impossible to construct. Moreover, even at higher frequencies they are rather large mechanical structures (they require shielding both for proper operation and to reduce susceptibility to RF noise), which makes them relatively expensive to manufacture (even in high volumes). They also are highly susceptible to environmental shock and drift, and they typically require an adjustment in value during the manufacturing process to make sure that they resonate accurately at the proper frequency.

Yet another known technique for building band-pass filters employs magnetically and/or capacitively coupled dielectric resonators, implemented either as cylindrical coaxial transmission lines, or as printed strip transmission lines sandwiched in between two ground plane shields. These resonators are short-circuited transmission lines, and as such are exploited for their ability to resonate at a particular frequency as a function of their length relative to the wavelength of the transmitted input signal (the length of the line is typically $\lambda/4$ for the wavelength $\lambda$ of the resonant frequency). Such resonators are capable of producing high $Q_L$ values to achieve responses having the fractional bandwidth characteristic requisite for many broadband signal-processing applications (i.e. 1–2%). Because the trace length increases as the desired resonant frequency decreases, however, such resonators are not suitable for anything other than UHF (i.e. between about 400 MHz and several GHz). They become cost prohibitive for HF and VHF applications because transmission line lengths increase to a prohibitive size. Moreover, their length must also be trimmed at production to ensure that they resonate at the requisite frequency.

Another well-known circuit topology for producing a band-pass filter response is that of the magnetically coupled double-tuned resonant circuit. Band-pass filters so implemented are the least expensive to manufactured relative to the other various prior art techniques discussed herein (they can be manufactured for a few cents each). Implementations of such filters heretofore known have been unable to achieve the large $Q_L$ values necessary to produce responses having small fractional bandwidths and low insertion loss requisite of many applications such as broadband signal processing (they have typically achieved no better than about 15% fractional bandwidth or greater). The reasons for their shortcomings in such applications will be apparent to those of skill in the art in view of the following discussion.

The generic topology of a series double-tuned circuit 10 is illustrated in FIG. 1a, and that of a parallel double-tuned circuit 100 is illustrated in FIG. 1b. The series tuned circuit has an input resonator circuit 12 that is magnetically coupled to an output resonator circuit 14. Likewise, the parallel tuned circuit 100 has an input resonator circuit 120 magnetically coupled to an output resonator circuit 140. The input resonators 12, 120 are coupled to an input source modeled by sources $V_S$ 18, 180 and associated source impedances $R_S$ 16 and 160 respectively. The output resonators 14, 140 are coupled to an output load impedance modeled by resistor $R_L$ 15, 150 respectively.

The input and output resonators 12, 14 of the series tuned circuit 10 are formed as a series connection between lumped series capacitors $C_{S1}$ and $C_{S2}$ 13 respectively, and inductors $L_1$ 17 and $L_2$ 19 respectively. The two series tuned resonators 12, 14 and the two parallel tuned resonators 120, 140 are magnetically coupled as a function of the physical proximity between their inductors, whereby a mutual inductance M 21 is created. $M=k\sqrt{L_1 \cdot L_2}$, where k is the coupling coefficient which has a value commensurate with the geometry and physical proximity (and thus reflects the percentage of total coupling) between the two resonators. The closer in proximity the two inductors 17, 19 or 170, 190 are, the greater the value of k and therefore the greater the mutual inductance between the resonators; likewise, the further they are apart, the lower the degree of coupling and thus the lower the value of k.

The parallel double-tuned circuit 100 is the theoretical dual of the series double-tuned circuit 10, and thus operates quite similarly. The resonators 120, 140 of the parallel tuned circuit 100 are formed as a parallel connection between lumped capacitors $C_{P1}$ 110 and $C_{P2}$ 130, and inductors $L_1$ 170 and $L_2$ 190 respectively. The parallel tuned resonators 120, 140 are also magnetically coupled as a function of the physical proximity between their inductors, whereby a mutual inductance M 210 is created. The mutual inductance of the parallel tuned circuit is given by the same equation, $M=k\sqrt{L_1 \cdot L_2}$, with its value of k dictated by the same considerations.

FIG. 2 illustrates three typical responses of a double-tuned resonant circuit (either series or parallel), for different values of the coupling coefficient k. Response 22 is obtained when the two resonators are critically coupled, which is the point at which the tuned resonator exhibits minimum insertion loss with average selectivity at the resonant frequency. Response 24 illustrates the response of the double-tuned resonators 10 and 100, when their input, output resonators are under-coupled. This occurs for values of k approaching zero. As the resonators are moved further apart, the value of its QL increases (the fractional bandwidth decreases) but the insertion loss also increases, which is not desirable. Response 26 occurs when the two inductors are so close together they become over-coupled (i.e. k approaches a value of 1). Response 26 is characterized by two maxima on either side of the resonant frequency, and the circuit exhibits its lowest $Q_L$ value (and thus its largest fractional bandwidth). From these responses, it can be seen that there is a tradeoff, for this type of filter, between the maximum attainable $Q_L$ value and insertion loss as a function of the coupling.

The $Q_L$ for a series tuned circuit is roughly determined as the reactance X of the tuned circuit network at the resonant frequency, divided by the load or source impedance coupled to it. Thus, $Q_L$ for the output resonator $$14 \text{ is } \cong \frac{w_o \cdot L_2}{R_L}.$$

Thus, for a given resonant frequency $w_o$, one could increase the $Q_L$ by increasing the value of $L_2$. (Of course, to increase the overall $Q_L$ for the double-tuned resonator, one would do the same for the input resonator 12 by increasing the value of $L_1$ as well). The problem with this approach is that there are practical limitations on the size of the inductors $L_1$, $L_2$ that can be manufactured and implemented at a reasonable cost. Moreover, as the values of $L_1$, $L_2$ are increased, the parasitic shunt capacitance associated with a lumped value inductor (typically a coil) degrades the frequency response of the filter at frequencies above 200 MHz. Finally, because the resonant frequency is determined by the equation $$w_o = \frac{1}{\sqrt{L_2 \cdot C_{s2}}}$$

(for the output resonator 14), the value of $C_{S2}$ must be reduced commensurately to maintain the value of $w_o$. There are also practical limitations on how small $C_{S2}$ can be built accurately.

FIG. 3 illustrates the series double-tuned circuit 10 of FIG. 1 with values for k, $C_{S1}$ 11 and $C_{S2}$ 13, and $L_1$ 17 and $L_2$ 19, designed to push the value of $Q_L$ for the circuit at a resonant frequency of 400 MHz. FIGS. 4a and 4b show the simulated response for the circuit 30 having the indicated component values as shown in FIG. 3. The pairs of values across the bottom of FIGS. 4a and 4b indicate the frequency (in MHz) and attenuation (in dB) values for the points 1–4 as indicated on the response curve. The response as shown in the scale provided in FIG. 4a illustrates the unacceptable performance of the filter at high frequencies for television signal processing applications. The smaller scale provided by FIG. 4b shows the 3 dB fractional bandwidth to be about 16% (and thus the approximate value of $Q_L$ is 6.25). As previously discussed, this is unacceptable for many broadband signal processing applications.

The $Q_L$ for a parallel tuned circuit is roughly determined as the admittance of the network at the resonant frequency, multiplied by the load or source impedance coupled to it. Thus, $Q_L$ for the parallel tuned output resonator 140 is $\cong w_o \cdot C_{P2} \cdot R_L$. Thus, it can be seen that to increase $Q_L$ for the parallel tuned output resonator, one could increase the value of $C_{P2}$ and $R_L$. $R_L$ can't be increased much above 100 ohms, as the signal would tend to be shunted to ground through parasitic shunt elements. Increasing $C_{P2}$ requires that $L_2$ be made very small. To manufacture lumped inductors on the order of 5 nH with acceptable accuracy is very difficult, as such inductors are very sensitive to geometric variation, especially longitudinally. Further more, obtaining and maintaining proper coupling between such small coils on a repeatable basis is nearly impossible, primarily due to high sensitivity of the coupling coefficient to dimensional variations of a small gap between the two coupled coils (because the coils must be dimensionally small for small inductance values, the gap between them must also be small to achieve the desired coupling). The requisite small gap magnifies sensitivity to small dimensional variations. Such component and dimensional variations cannot be tolerated when fractional bandwidths on the order of 1% are required.

FIG. 5 illustrates the parallel double-tuned circuit 100 of FIG. 1 with values for k, $C_{P1}$ 110 and $C_{P2}$ 130, and $L_1$ 170/$L_2$ 190, with an L to C ratio designed to push the value of $Q_L$ for the circuit at a resonant frequency of 400 MHz. FIGS. 6a and 6b show the simulated response for the circuit 50 having the indicated component values as shown in FIG. 3. The pairs of values across the bottom of FIGS. 6a and 6b indicate the frequency (in MHz) and attenuation (in dB) values for the points 1–4 as indicated on the response curve. The response as shown in the scale provided in FIG. 6a illustrates the unacceptable performance of the filter in the stop-band, even though it operates more symmetrically at high frequencies relative to the series tuned circuit 30 of FIG. 3. Even though the coils values used in this example of the prior art are being pushed to the limit, the bandwidth of this filter is still not narrow enough for many applications. The smaller scale provided by FIG. 6b shows the 3 dB fractional bandwidth to be about 15.5% (and thus the approximate value of $Q_L$ is 6.45. As previously discussed, this is unacceptable for many broadband signal processing applications that require fractional bandwidths of 1 to 2% (i.e. $Q_L$ values in the 50 to 100 range).

Thus, those of skill in the art will recognize the need for band-pass filter circuits that provide characteristics required for many broadband signal processing applications over bandwidths spanning about 50 to 1000 MHz. Those characteristics are namely high $Q_L$ values to provide high selectivity and therefore small fractional bandwidths, high attenuation in the stop-band, low insertion loss in the pass-band but which can be manufactured as cheaply and repeatably as the tuned resonator circuits of the prior art.

SUMMARY OF THE INVENTION

It is therefore an objective of a first embodiment of the present invention to provide a band-pass filter employing a parallel double-tuned magnetically coupled resonator topology that can achieve substantially higher values of $Q_L$ than previously attainable using such a topology.

It is another objective of the first preferred embodiment to achieve the higher values of $Q_L$ with a topology that can be manufactured inexpensively and with a high degree of repeatable accuracy.

It is a further objective of the first preferred embodiment to be relatively immune to RF noise in its environment.

It is an objective of a second embodiment of the present invention to achieve still higher values of $Q_L$, with low insertion loss and a steeper roll-off between the pass-band and the stop-band at both lower and higher frequencies, with the addition of only one additional component to the first embodiment.

It is an objective of a third embodiment of the present invention to achieve still higher values of $Q_L$, with low insertion loss and a steeper roll-off between the pass-band and the stop-band (at both lower and higher frequencies), with the addition of only one additional component to a known series double-tuned magnetically coupled resonator topology.

These and other objectives will be clear to those of skill in the art in view of the detailed description of the invention.

A first preferred embodiment of the band-pass filter of the present invention employs a parallel double-tuned resonator topology that achieves higher values of $Q_L$ by using an electrically short (on the order of 1% of the wavelength of the resonant frequency) transmission line as a very small inductance component by which the resonators are magnetically coupled. The transmission line is manufactured as a metal trace having precisely controlled geometric dimensions by which the requisite inductance value is realized. The dielectric constant of the printed circuit board material is 4.65 with a thickness of 1.5 nm. The traces are made with copper having a thickness of 0.018 mm. The microstrip inductors are then physically positioned to obtain a coefficient of coupling (k) on the order of 0.01 to 0.02. One end of the transmission line traces is coupled to the series capacitor, and the other is terminated to ground. Inductor values can be accurately produced down to about 0.5 nH with an accuracy of about ±2%.

In a second preferred embodiment of the band-pass filter of the present invention, a parallel double-tuned resonator of the first preferred embodiment is modified by the addition of a capacitor, within each of the magnetically coupled resonators, the capacitor being coupled in series with, and having a much smaller value than, the shunt capacitance that is in parallel with the magnetically coupled microstrip transmission line inductors.

In a third preferred embodiment of the invention, a prior art series double-tuned resonator topology is modified by the addition of a shunt capacitance within each of the resonators, the shunt capacitance coupled in parallel with the series components of the two resonators, and having a value that is much larger than the value of the capacitance in series with the inductance. The inductance is realized preferably using an air coil or other known lumped inductance element.

The second and third embodiments are both capable of being used as an electronic tuner, simply by substituting a veractor or other known controllable capacitance for either the series or shunt capacitors of the resonators. Multiple resonators in any of the three preferred embodiments can be cascaded together to increase the complexity of the transfer function, thereby increasing the $Q_L$ and the slope or roll-off from the pass band to the stop-band.

Any of the preferred embodiments can be arranged in a differential configuration to cancel any common mode noise that might be induced in the inductors from the environment by arranging the inductors such that their network currents flow in opposite directions. The preferred embodiments can also be arranged in balanced-to-balanced and balanced-to-unbalanced configurations. Any of the preferred embodiments can have its resonators physically arranged relative to each other in no particular position. Special cases such as parallel (with 0 degrees or 180 degrees orientation) or perpendicular relative positions of the resonators are of primary interest, although other orientations (such as 45 degrees or similar) can offer additional topological flexibility, as well as provide an additional degree of freedom to control the coupling coefficient k. Finally, the component values of the resonators of any of the preferred embodiments can be arranged in either a symmetrical or asymmetrical arrangement, either for impedance transformation or to adjust the frequency response of the filters.

BRIEF DESCRIPTION OF THE DRAWINGS

FIG. 30 is a table that provides equivalent bulk inductance values for the resonators of each of the embodiments depicted in FIGS. 8b, 11, 13, 15, 17, 19 and 21.

DETAILED DESCRIPTION OF THE INVENTION

Figure 1A:
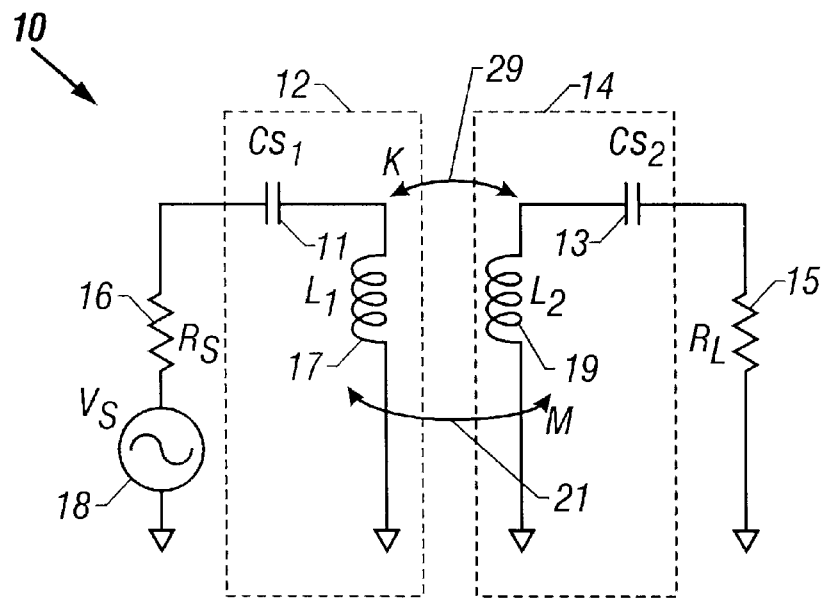
FIG. 1a is an illustration of a series double-tuned magnetically coupled resonator topology of the prior art.
Figure 1B:
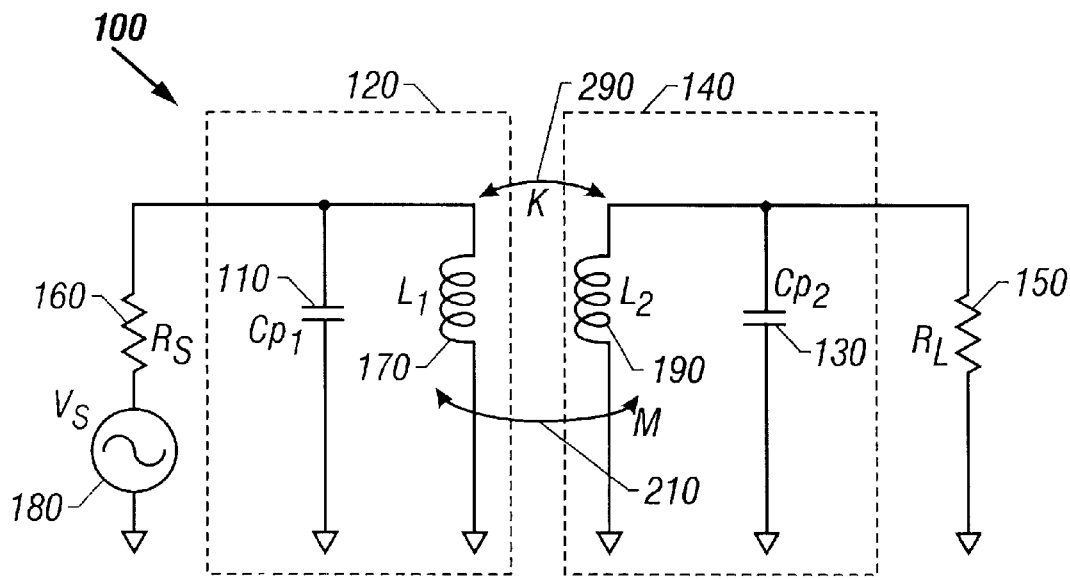
FIG. 1b is an illustration of a parallel double-tuned magnetically coupled resonator topology of the prior art.
Figure 2:
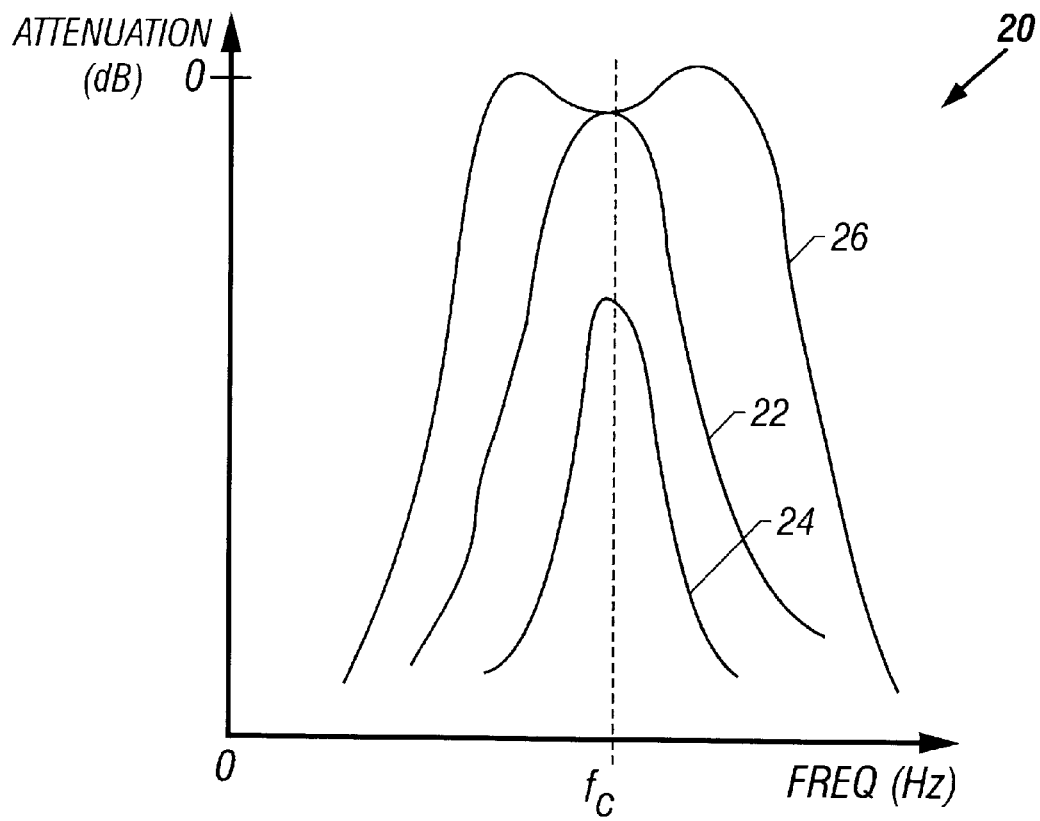
FIG. 2 is an illustration of three typical responses for the resonators of FIGS. 1a and 1b as the value of the coupling coefficient k is changed.
Figure 5:
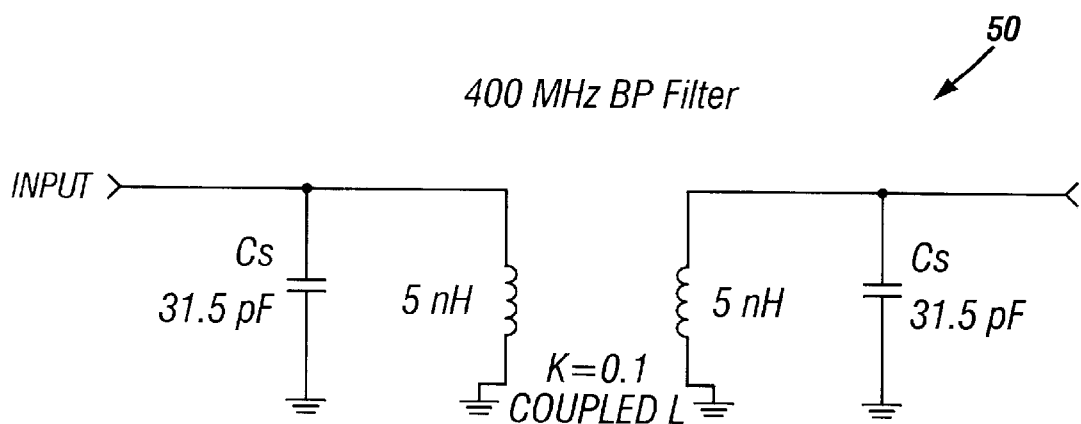
FIG. 5 is an example of the parallel resonator of FIG. 1b with extreme component values for prior art implementations of the resonator to achieve a maximum $Q_L$.

The following is a detailed description of the preferred embodiments of the present invention. As previously discussed, the double-tuned resonators of FIGS. 3 and 5 fell short of achieving the values of $Q_L$ required for many broadband applications, even when their LC ratios were increased to increase their $Q_L$. With respect to the parallel double-tuned resonator topology of FIGS. 1b and 5, the limitation was that the values of L could not be decreased beyond approximately 5 nH.

Figure 7:
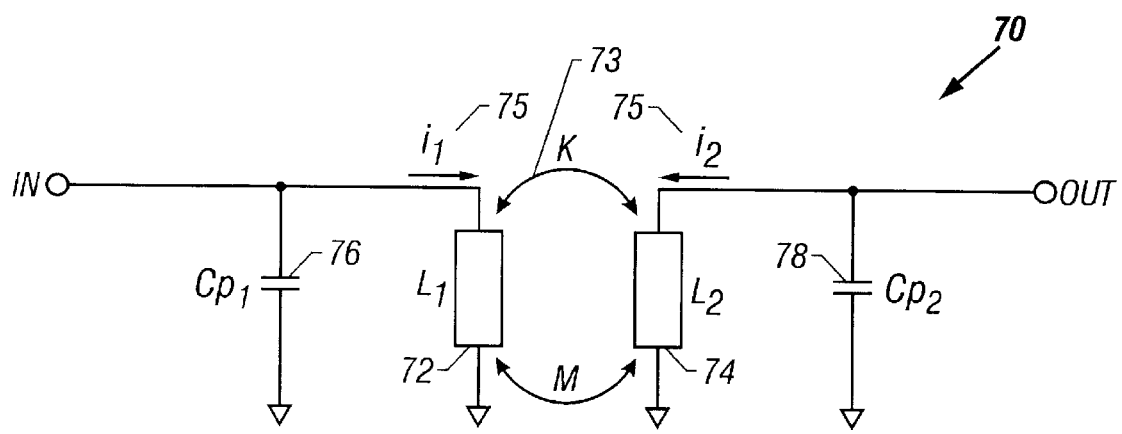
FIG. 7 is an example of the parallel resonator of the first preferred embodiment of the present invention using a small grounded microstrip transmission line to achieve a very small but accurate effective inductance.

In a first preferred embodiment of the invention shown in FIG. 7, a metal trace formed of copper on a printed circuit board is used as inductors $L_1$ 72 and $L_2$ 74 for the parallel double-tuned resonator 70. The metal traces are coupled at one end to the shunt capacitors $C_{P1}$ 76 and $C_{P2}$ 78 respectively; their other ends are terminated to ground. Effective inductance values down to 0.5 nH are attainable with an accuracy of ±2%. Thus, it can be appreciated that the $Q_L$ of such a resonator can be further increased beyond values attainable by the prior art simply because the inductance values may be decreased accurately below 5 nH, which permits the values of $C_{P1}$ 76 and $C_{P2}$ 78 to be increased. An additional benefit to this novel and unobvious use of microstrip transmission lines as inductor elements is that the currents i1 and $i_2$ (75) flowing at and close to the resonance frequency are very large because the impedance of the very small inductors is so low. The increased currents will boost the coupling. Thus, the inductor elements may be even more loosely coupled, which further maximizes the $Q_L$ without suffering unacceptable insertion loss in the pass-band. Moreover, because they have small inductance values which results in a small physical size, as well as a very low physical profile with respect to the PCB, their susceptibility to RF noise (and, by reciprocity, radiation) is significantly lower relative to the lumped inductor components of the prior art. Finally, they are easy and very low in cost to manufacture, with a high degree of accuracy and repeatability.

Figure 8A:
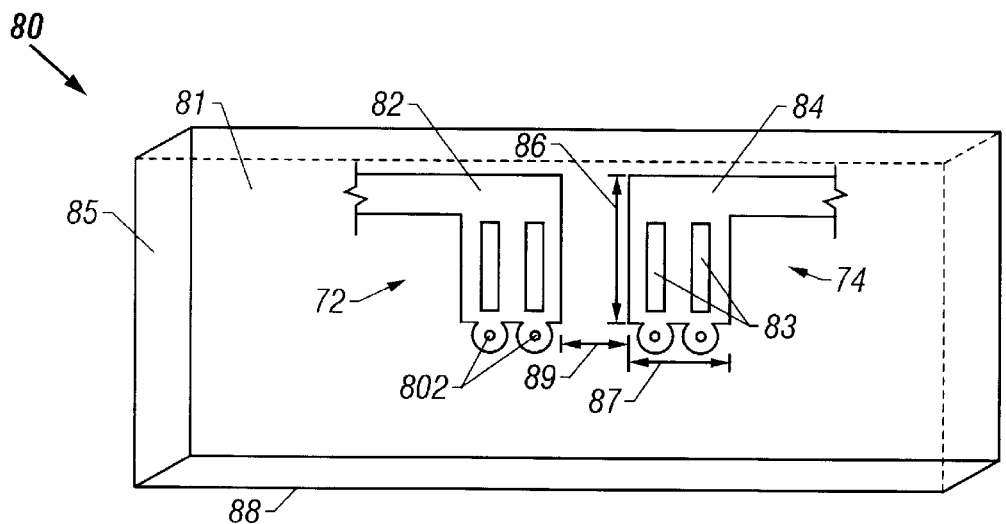
FIG. 8a is a plan view of a physical representation of the micro-strip effective inductance elements of the present invention.

FIG. 8a illustrates a plan view of a portion of a PCB upon which inductor elements $L_1$ 72 and $L_2$ 74 (FIG. 7) are built. In the preferred embodiment, the inductor elements are formed on the top surface 81 of the PCB 80 as copper micro-strip traces 82 and 84 respectively. The micro-strips are manufactured using well-known metal deposition and etching techniques. The geometric dimensions of the micro-strips (i.e. height 86, width 87) the spacing 89 between them determine the effective inductance of the elements as well as the degree of coupling 73 given by coupling coefficient k. The thickness of the traces is preferably 0.018 mm. The thickness or height 85 of the PCB is preferably 1.5 mm, and is constructed of a material having a dielectric constant of 4.65. The terminated ends of the micro-strips are grounded to the ground-plane 88 of the PCB 80 via through-holes 802. The through-holes 802 have their own self-inductance (in the order of 0.1 nH, depending on the hole diameter) which must be accounted for in the implementation. If necessary, providing multiple ground holes will lower the total inductance of the holes. The ground-plane 88 is typically formed on the backside of the PCB, but could be located on top of or inside the PCB 80.

Figure 6A:
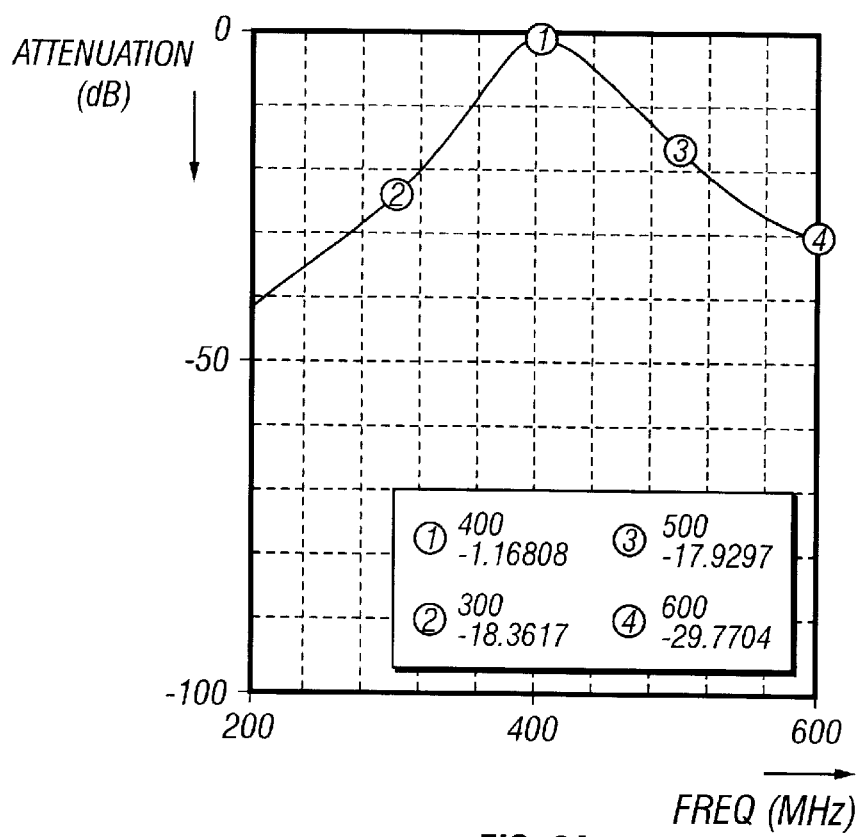
FIG. 6a is a simulated response for the prior art resonator of FIG. 5 using a broad scale for both frequency (40 MHz/div.) and attenuation (10 dB/div.).
Figure 6B:
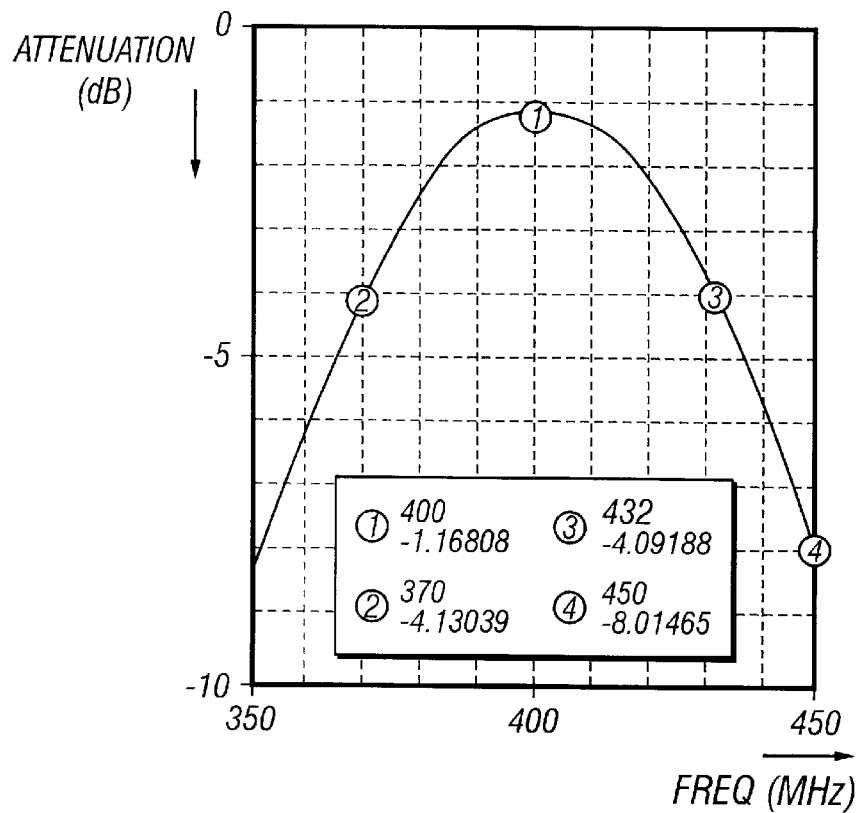
FIG. 6b is the simulated response for the prior art resonator of FIG. 5 using a smaller scale for both frequency (10 MHz/div.) and attenuation (1 dB/div.).

In the preferred embodiment, the micro-strips can be broken up into multi-strips by etching away portions 83 of the metal inside the micro-strip as shown. This provides an additional degree of freedom in controlling the effective value of the inductance relative to the coupling coefficient k. For example, by employing three micro-strip lines in parallel (as shown in FIG. 8a), each having a width of 2 mm and a length of 5.5 mm, an effective inductance of about 0.72 nH can be realized. A circuit representation of a filter implementation that employs the three line inductance elements of FIG. 8a is illustrated with component values in FIG. 8b. The improved response for the double-tuned resonator topology using microstrip inductance elements over the prior art implementation of the topology using lumped inductor components (FIG. 5) is illustrated by comparison of the simulated output responses of FIGS. 9a and 9b (for the present invention) with the responses of FIGS. 6a and 6b (for the prior art). The first embodiment of the present invention achieves a $Q_L$ of about 25 (and thus a fractional bandwidth of about 4%) at a resonant frequency of 400 MHz, compared to a $Q_L$ of about 6.5 (and a fractional bandwidth of about 15.5%) for the prior art at the same frequency. The out-of-band attenuation is also significantly improved.

Those of skill in the art will recognize the novelty and nonobvious use of microstrip transmission lines as effective inductor elements in magnetically coupled resonators, which is significantly distinctive over the prior use of microstrip transmission lines as resonators. The use of microstrip transmission lines as resonators relies on the inherent resonance of transmission lines when their length is the appropriate fraction (typically one-quarter of the wavelength of the center or resonant frequency). The present invention uses them as effective inductor components in a parallel double-tuned magnetically coupled resonator topology to achieve inexpensive, highly accurate and very small effective inductors. As previously discussed, to use transmission lines as resonators for the broadband applications of interest would require transmission lines of prohibitively long lengths. The length of the micro-strip lines of the present invention are only on the order of 0.5% to 10% of the wavelength of the resonant frequencies of interest. Thus, they are not used for their inherent resonance as in the prior art.

Figure 10A:
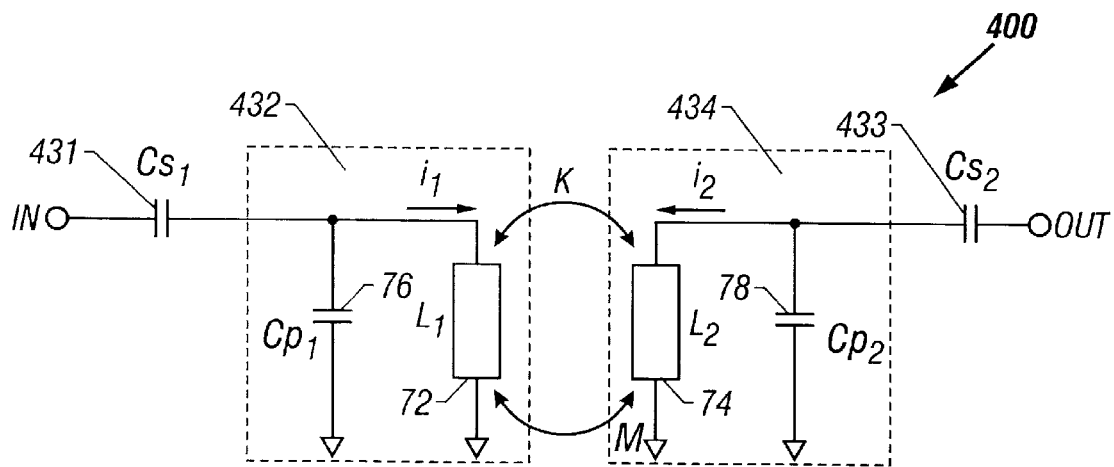
FIG. 10a is an illustration of a parallel tuned resonator circuit using microstrip transmission lines as bulk inductance elements and having an additional capacitive element in series between the resonators and the input and output signals.
Figure 10B:
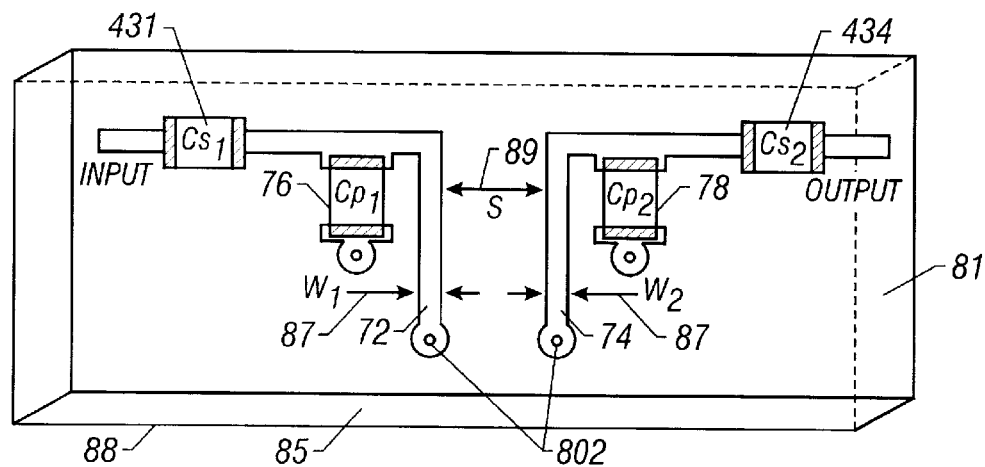
FIG. 10b is an illustration of a physical embodiment the parallel tuned resonator of FIG. 10a using printed circuit board manufacturing techniques.

FIG. 10a illustrates a second preferred embodiment of the invention, wherein an additional capacitor ($C_{s1}$ 431 and $C_{s2}$ 433 respectively) is added in series with the parallel tuned input 432 and output 434 resonators of the topology of the first preferred embodiment of the invention (FIG. 7). The values of $C_{s1}$ 431 and $C_{s2}$ 433 are very small relative to the values of the shunt capacitors $C_{P1}$ 76 and $C_{P2}$ 78. While the addition of such series capacitors would likely be counterintuitive to one of ordinary skill in the art, the addition of $C_{s1}$ 431 and $C_{s2}$ 433 actually even further improves the response of the band-pass filter of the first preferred embodiment significantly. This addition of two very inexpensive components alters the band-pass filter from a fourth-order filter to a sixth-order filter. This can be seen by comparing the resulting transfer function for the implementation of the parallel double-tuned topology of the present invention (FIG. 7) with the modified topology of FIG. 10a. FIG. 10b illustrates a physical implementation of the embodiment of FIG. 10a.

The transfer function for the topology of FIG. 7 is $$H(s) = g_0 \cdot \frac{s^3}{(s^2 + a_1 s + b_1) \cdot (s^2 + a_2 + b_2)}.$$

The transfer function for the enhanced topology of FIG. 10a is $$H(s) = g_p \cdot \frac{s^3}{(s^3 + c_1 s^2 + d_1 s + e_1) \cdot (s^3 + c_2 s^2 + d_2 s + e_2)}.$$

(Where s=complex frequency (i.e. $\sigma+j\omega$), $g_o$ and $g_p$ are constants, and $a_1$, $b_1$, $a_2$, $b_2$, $c_1$, $d_1$, $e_1$, $c_2$, $d_2$, and $e_2$ are polynomial coefficients). The poles added to the transfer function defining the modified filter's frequency response increase the roll-off from the pass-band to the stop-band at high frequencies by changing the slope from $$\frac{1}{s} \text{ (as } s \to \infty \text{) to } \frac{1}{s^3}.$$

Thus, not only is the $Q_L$ still further increased, but the attenuation at high frequencies is also enhanced. Finally, $C_{s1}$ 431 and $C_{s2}$ 433 also improve the low frequency performance of the filter.

Figure 11:
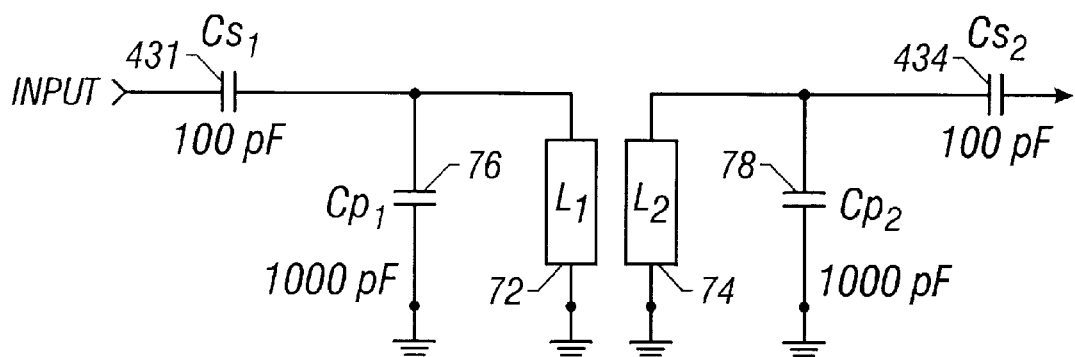
FIG. 11 illustrates an embodiment of the circuit of FIGS. 10 and 11 giving values for the components to achieve a 70 MHz narrow band-pass filter.
Figure 12A:
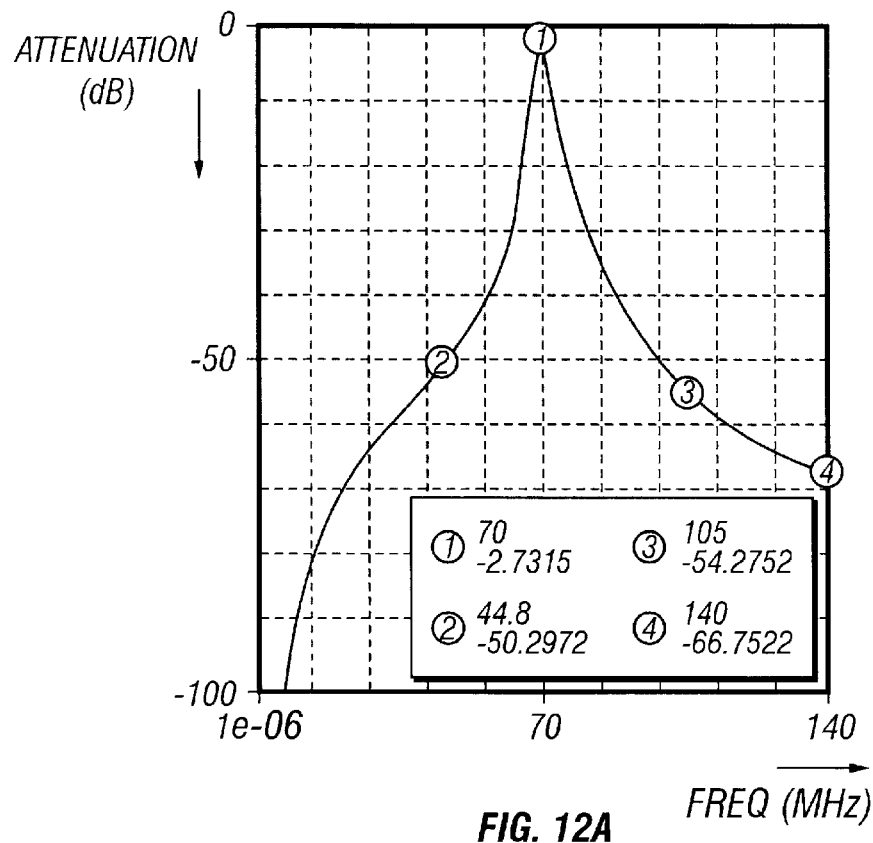
FIG. 12a is a simulated response for the resonator of FIG. 11 using a broad scale for both frequency (40 MHz/div.) and attenuation (10 dB/div.).
Figure 12B:
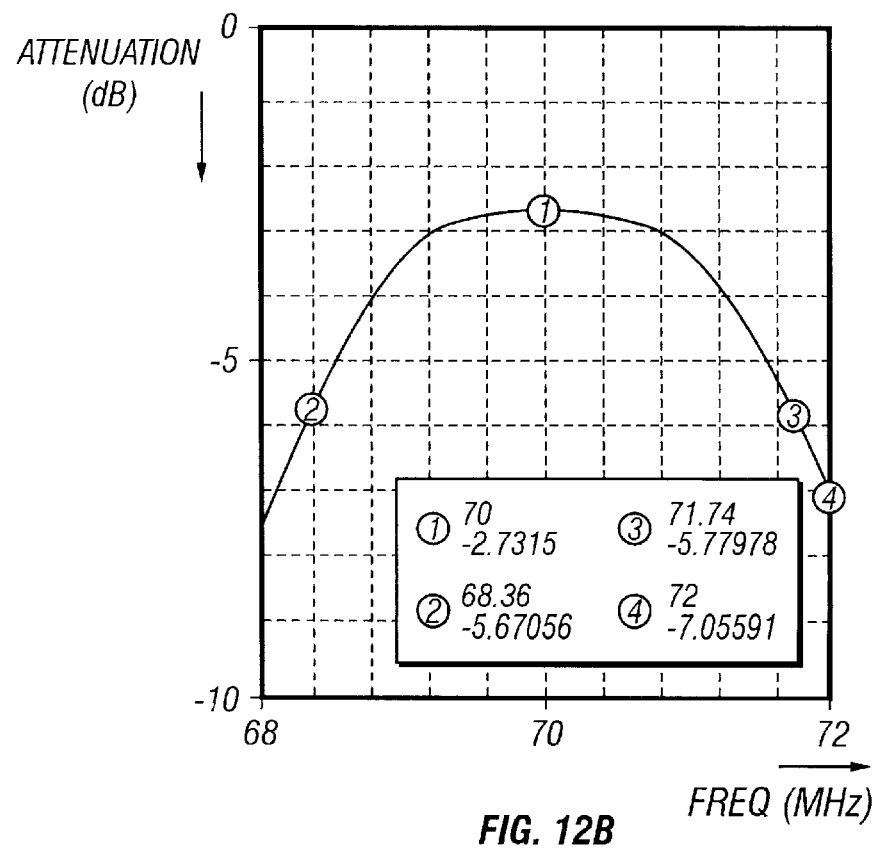
FIG. 12b is the simulated response for the resonator of FIG. 11 using a smaller scale for both frequency (10 MHz/div.) and attenuation (1 dB/div.).

An implementation for a band-pass circuit having a center frequency of 70 MHz using the topology of FIG. 10a (including the micro-strip transmission lines of the first preferred embodiment) is shown in FIG. 11. A simulated output response of the filter of FIG. 11 is illustrated in FIGS. 12a and 12b. The $Q_L$ for this circuit is about 21; the fractional bandwidth is about 4.8%.

Figure 13:
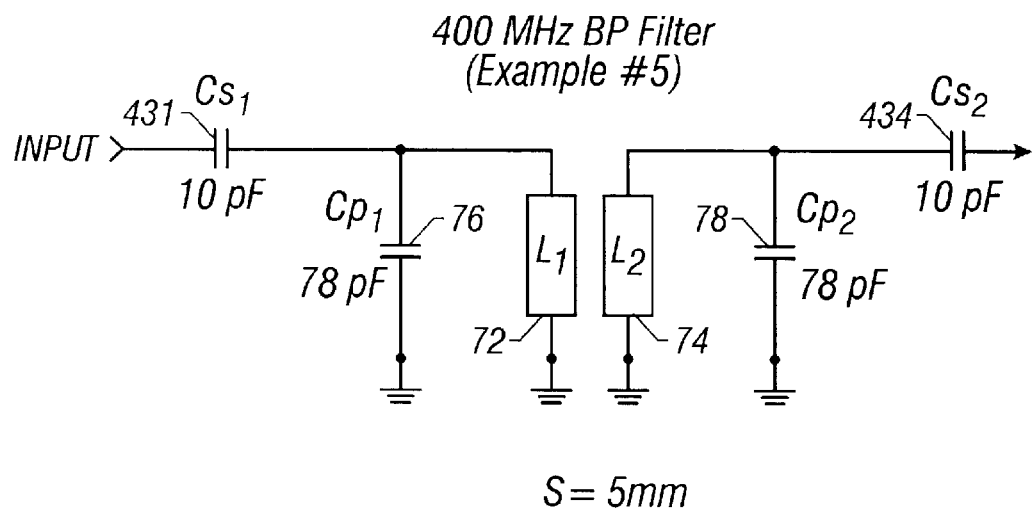
FIG. 13 illustrates an embodiment of the parallel tuned resonator of FIG. 10a with component values to achieve a 400 MHz narrow band-pass filter
Figure 14A:
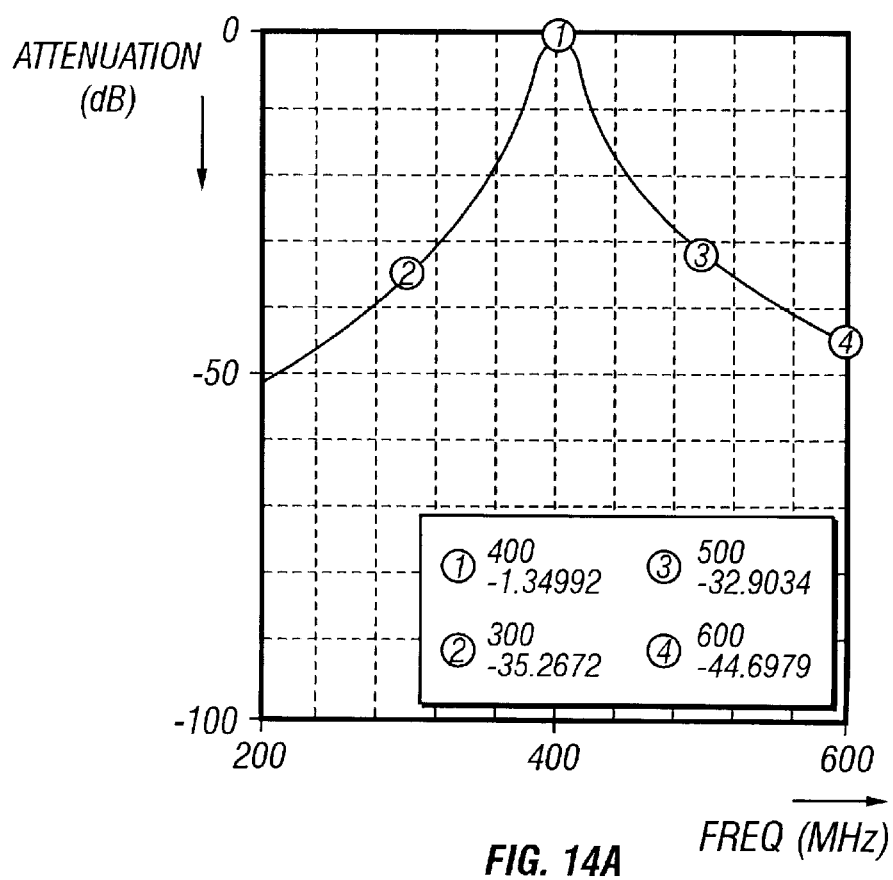
FIG. 14a is a simulated response for the resonator of FIG. 13 using a broad scale for both frequency (40 MHz/div.) and attenuation (10 dB/div.).
Figure 14B:
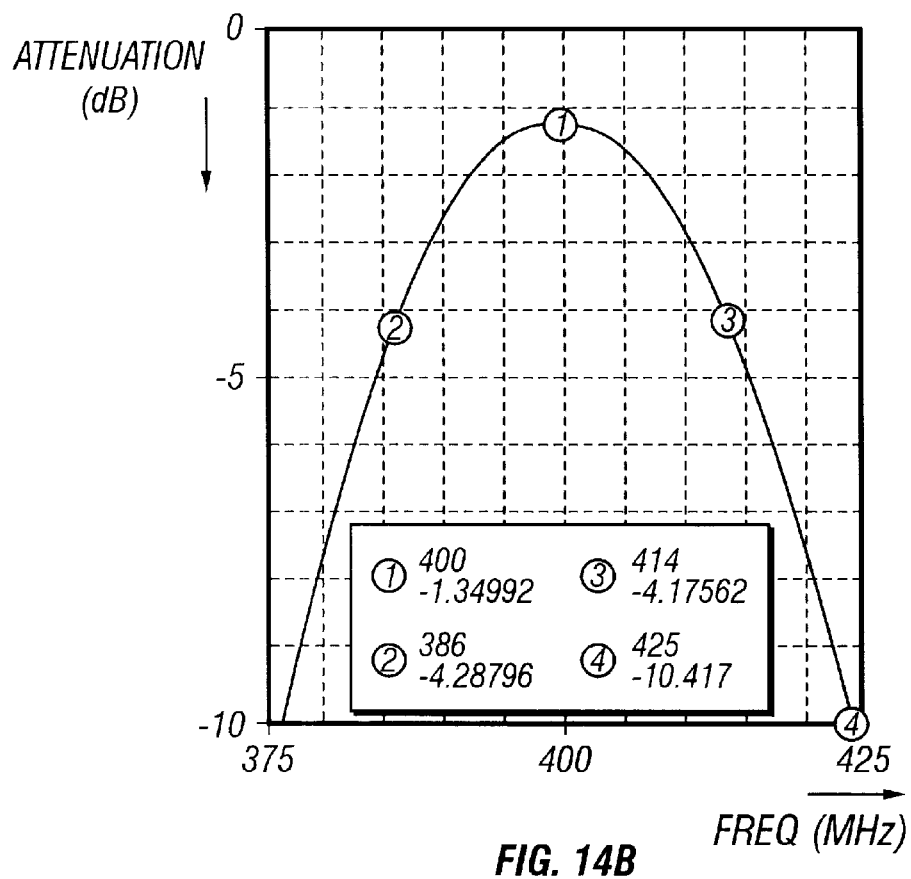
FIG. 14b is the simulated response for the resonator of FIG. 13 using a smaller scale for both frequency (10 MHz/div.) and attenuation (1 dB/div.).

An implementation for a band-pass circuit having a center frequency of 400 MHz using the topology of FIG. 10a (including the micro-strip transmission lines of the first preferred embodiment) is shown in FIG. 13. A simulated output response of the filter of FIG. 13 is illustrated in FIGS. 12a and 12b. The $Q_L$ for this circuit is about 21; the fractional bandwidth is about 4.8%.

Figure 15:
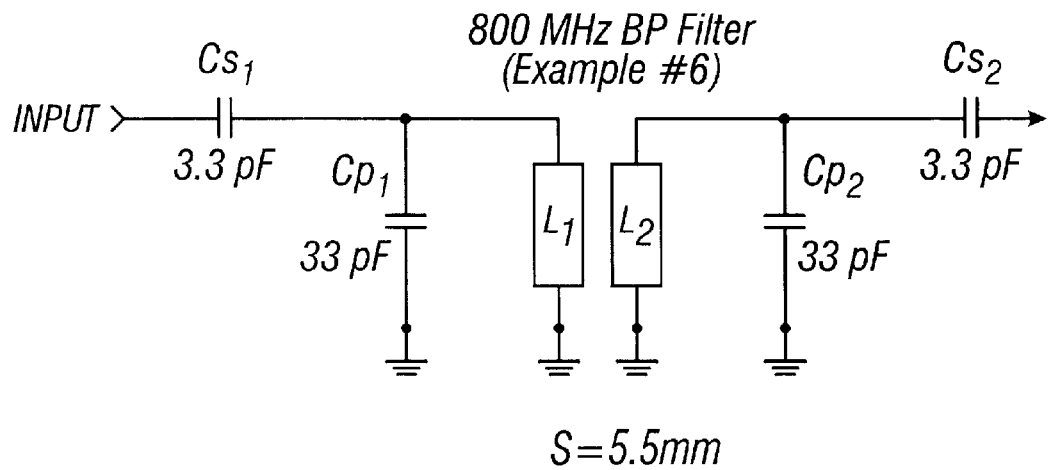
FIG. 15 is an illustration of an embodiment of the parallel tuned resonator of FIG. 10a with component values to achieve an 800 MHz band-pass filter.
Figure 16A:
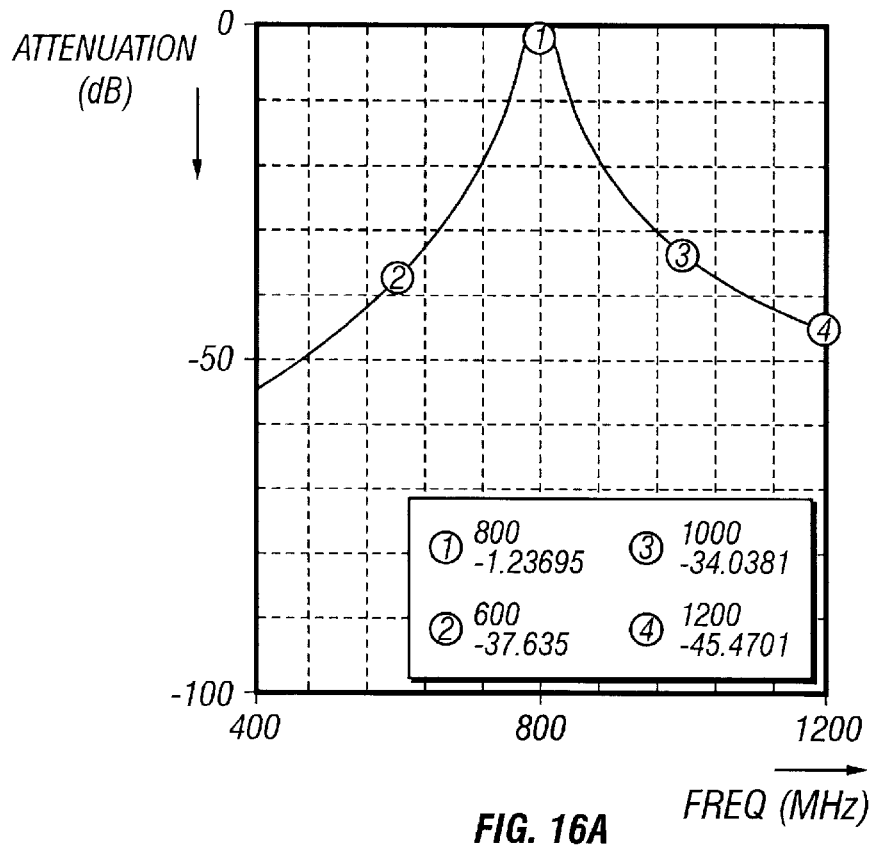
FIG. 16a is a simulated response for the resonator of FIG. 15 using a broad scale for both frequency (40 MHz/div.) and attenuation (10 dB/div.).
Figure 16B:
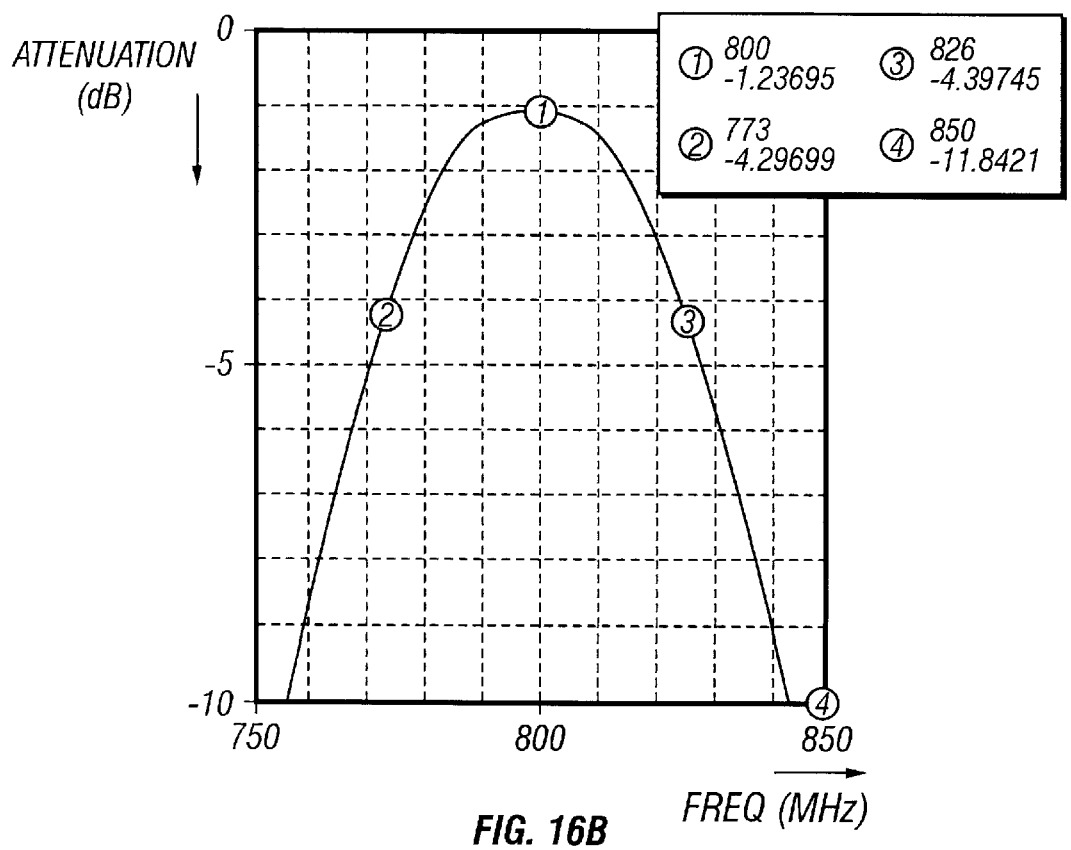
FIG. 16b is the simulated response for the resonator of FIG. 15 using a smaller scale for both frequency (10 MHz/div.) and attenuation (1 dB/div.).

An implementation for a band-pass circuit having a center frequency of 800 MHz using the topology of FIG. 10a (including the micro-strip transmission lines of the first preferred embodiment) is shown in FIG. 15. A simulated output response of the filter of FIG. 15 is illustrated in FIGS. 16a and 16b. The $Q_L$ for this circuit is about 15; the fractional bandwidth is about 6.6%.

Figure 8B:
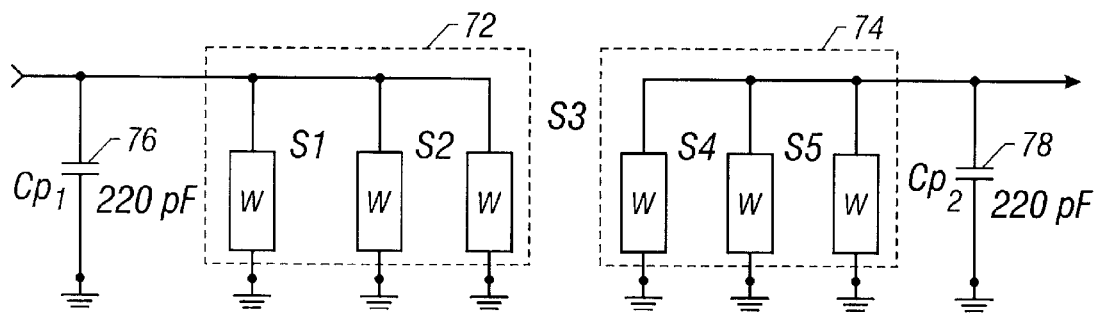
FIG. 8b is an example of the parallel resonator of FIG. 7 wherein the inductance elements are split into three parallel micro-strips as illustrated in FIG. 8a to achieve a low effective inductance for the resonators.
Figure 9A:
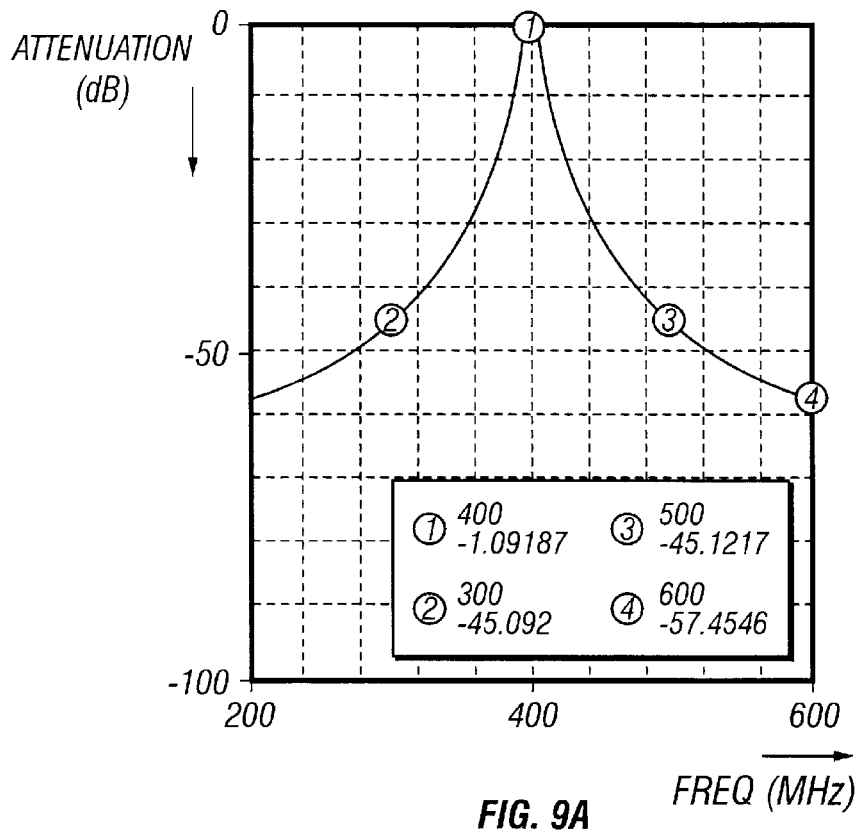
FIG. 9a is a simulated response for the resonator of FIG. 8b using a broad scale for both frequency (40 MHz/div.) and attenuation (10 dB/div.).
Figure 9B:
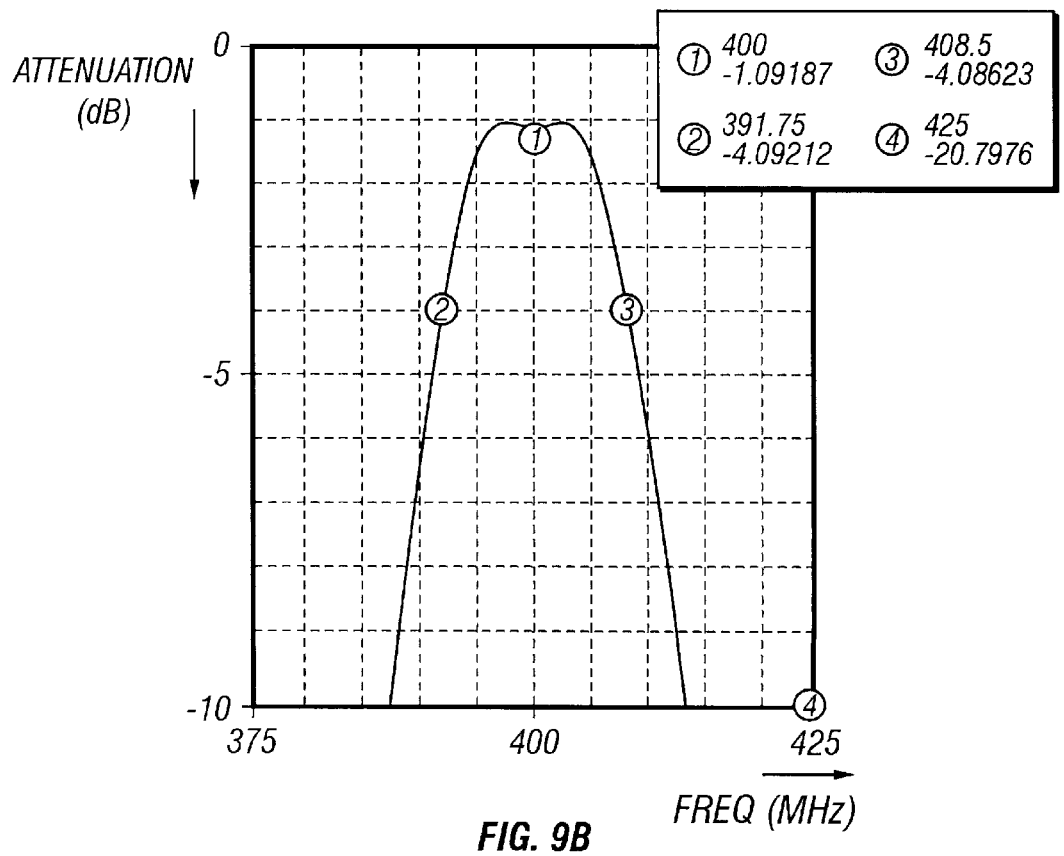
FIG. 9b is the simulated response for the resonator of FIG. 8b using a smaller scale for both frequency (10 MHz/div.) and attenuation (1 dB/div.).
Figure 17:
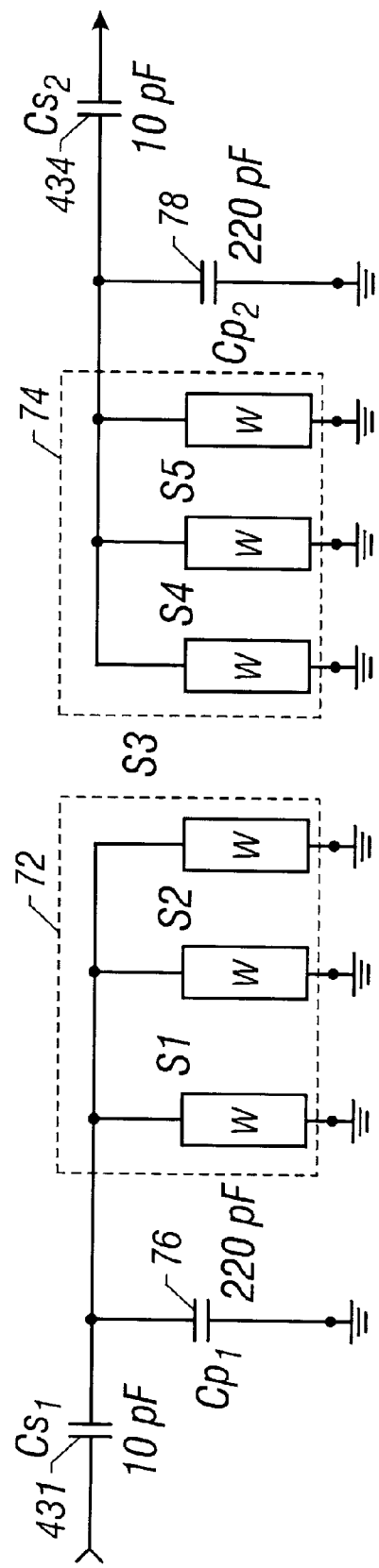
FIG. 17 illustrates an embodiment of the parallel tuned resonator of FIG. 10a for which the inductive elements for each resonator are implemented with three microstrips in parallel, to further reduce the inductance values for the resonators.
Figure 18A:
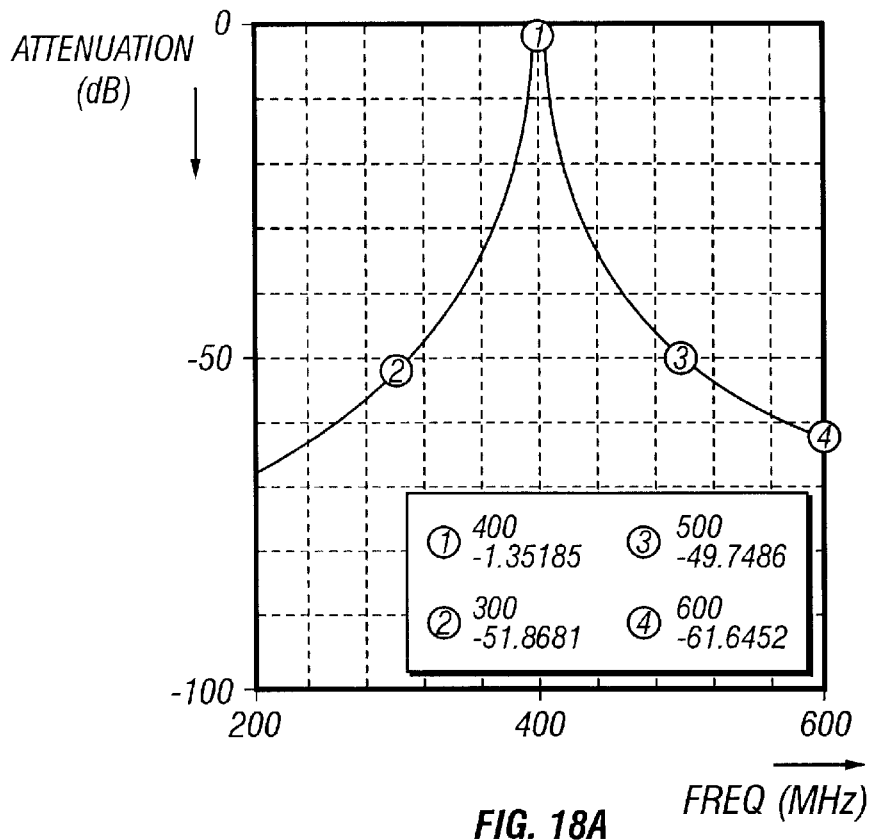
FIG. 18a is a simulated response for the resonator of FIG. 17 using a broad scale for both frequency (40 MHz/div.) and attenuation (10 dB/div.).
Figure 18B:
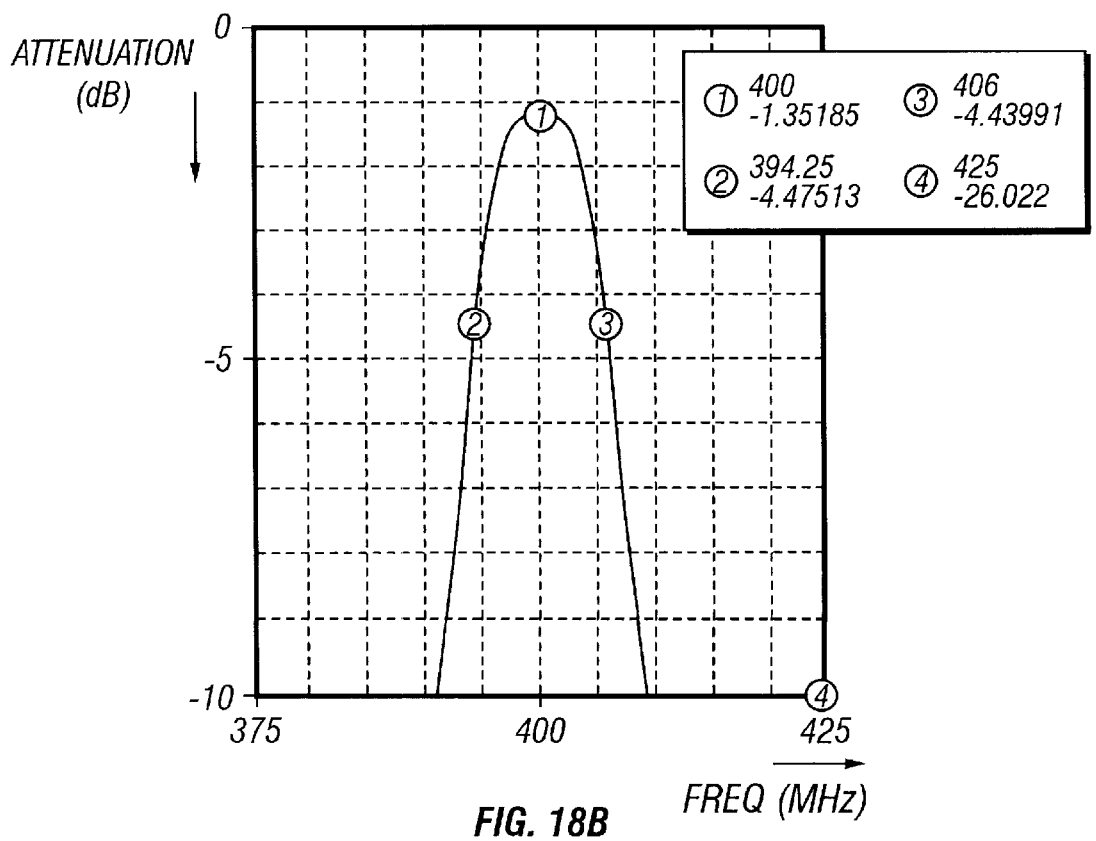
FIG. 18b is the simulated response for the resonator of FIG. 17 using a smaller scale for both frequency (10 MHz/div.) and attenuation (1 dB/div.).

An implementation for a band-pass circuit having a center frequency of 400 MHz using the topology of FIG. 10a (but including the multi micro-strip transmission lines in parallel of FIGS. 8a and 8b) is shown in FIG. 17. A simulated output response of the filter of FIG. 17 is illustrated in FIGS. 18a and 18b. The $Q_L$ for this circuit is about 34; the fractional bandwidth is about 2.9%.

Figure 19:
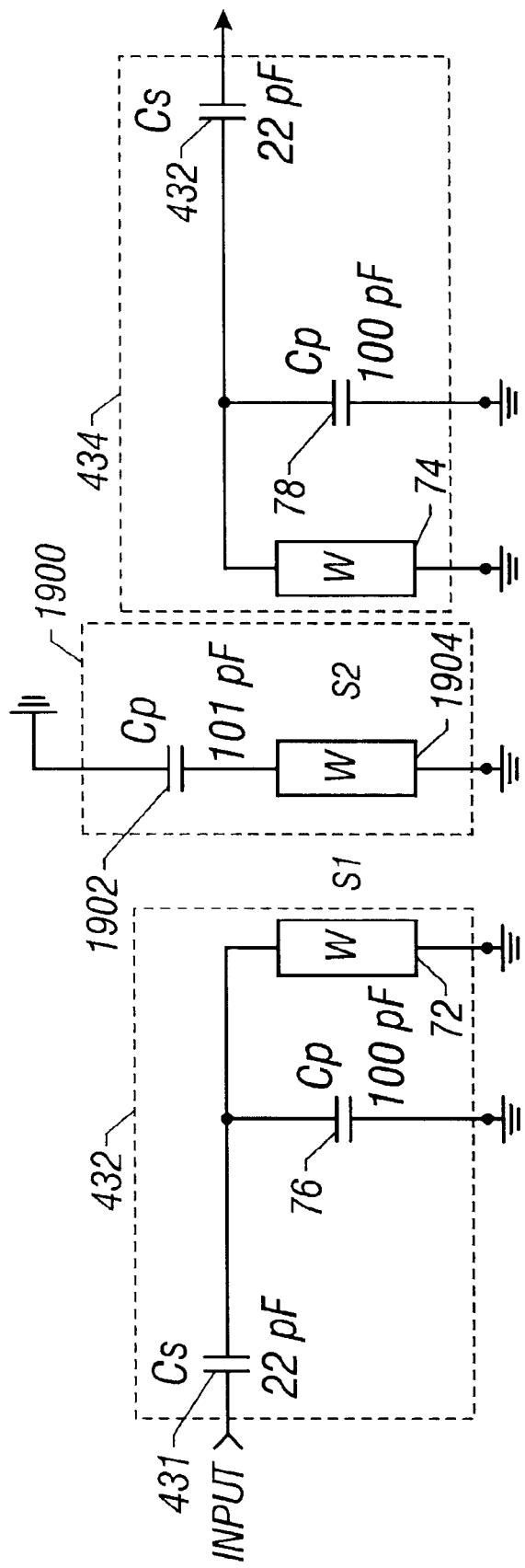
FIG. 19 illustrates an embodiment of the parallel tuned resonator of FIG. 10a having three resonators in parallel to achieve a narrow band-pass filter at 400 MHz.
Figure 20A:
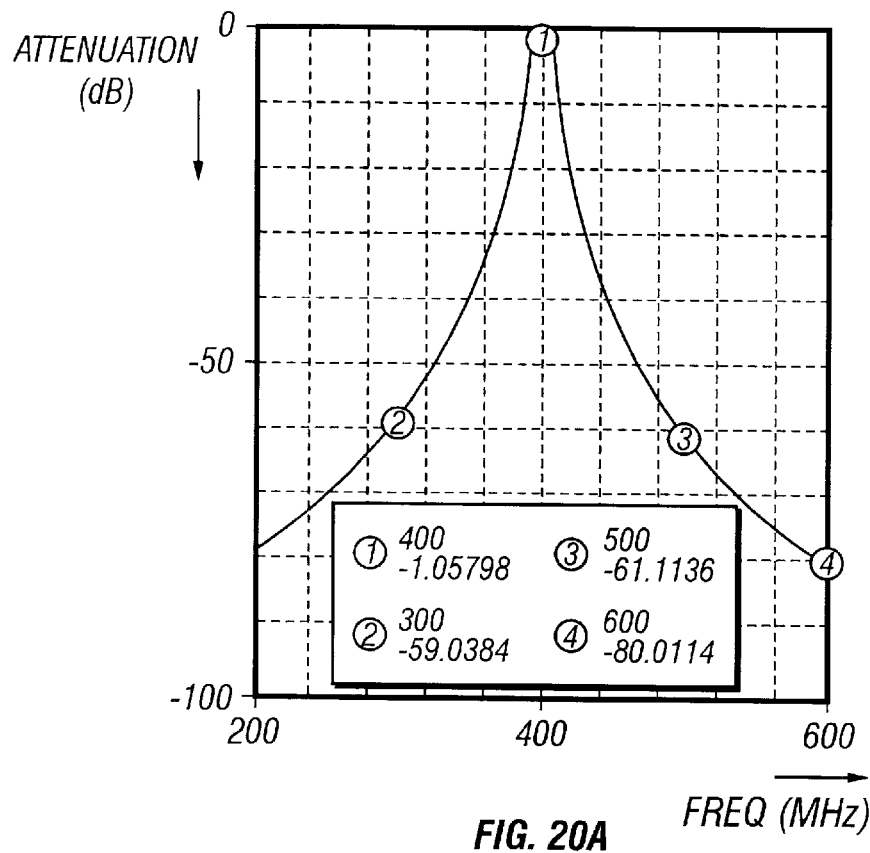
FIG. 20a is a simulated response for the resonator of FIG. 19 using a broad scale for both frequency (40 MHz/div.) and attenuation (10 dB/div.).
Figure 20B:
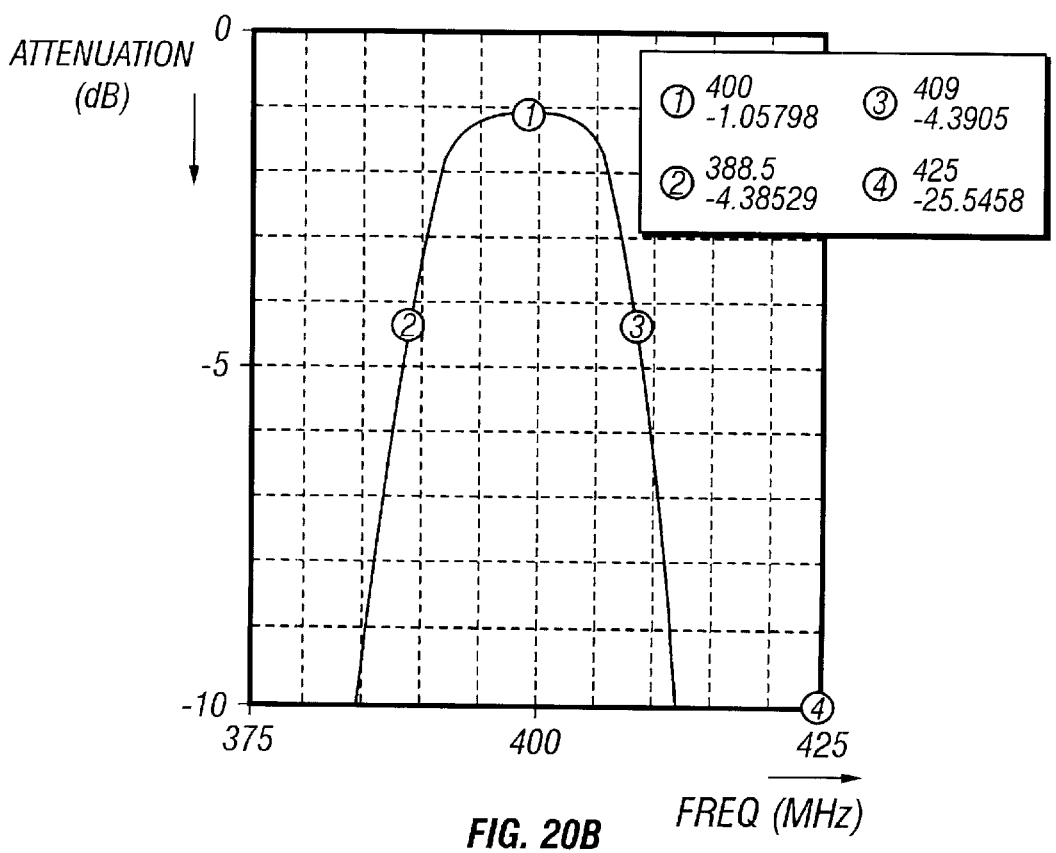
FIG. 20b is the simulated response for the resonator of FIG. 19 using a smaller scale for both frequency (10 MHz/div.) and attenuation (1 dB/div.).

An implementation for a band-pass circuit having a center frequency of 400 MHz and using the topology of FIG. 10a (including the micro-strip transmission lines of the first preferred embodiment) is shown in FIG. 19 wherein an additional resonator 1900 is coupled between input and output resonators 432, 434. Resonator 1900 is of the same topology as resonators 432, 434, having a capacitor $C_{P3}$ 1902 in parallel with a micro-strip inductive component 1904. A simulated output response of the filter of FIG. 19 is illustrated in FIGS. 20a and 20b. The $Q_L$ for this circuit is about 19.5; the fractional bandwidth is about 5%.

Figure 21:
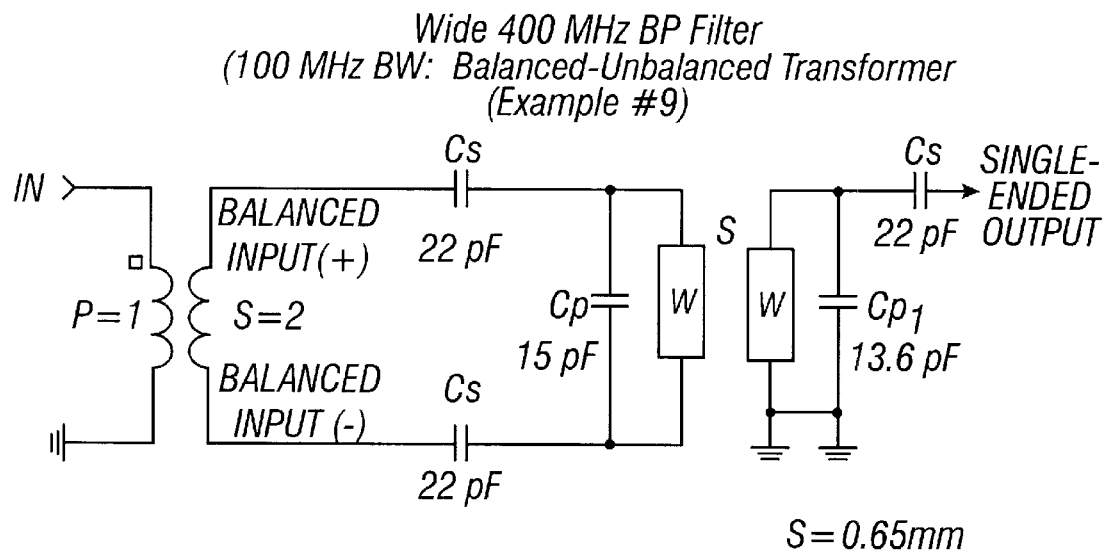
FIG. 21 is an embodiment of the parallel tuned resonator of FIG. 10a employing a balanced—unbalanced transformer to achieve a 400 MHz narrow band-pass filter.
Figure 22A:
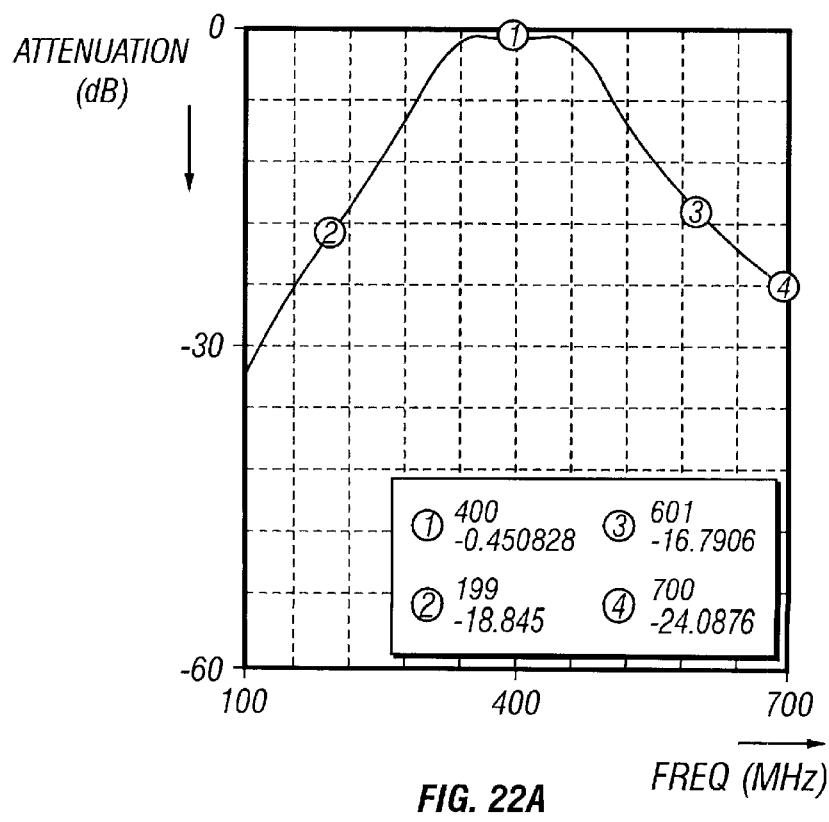
FIG. 22a is a simulated response for the resonator of FIG. 21 using a broad scale for both frequency (40 MHz/div.) and attenuation (10 dB/div.).
Figure 22B:
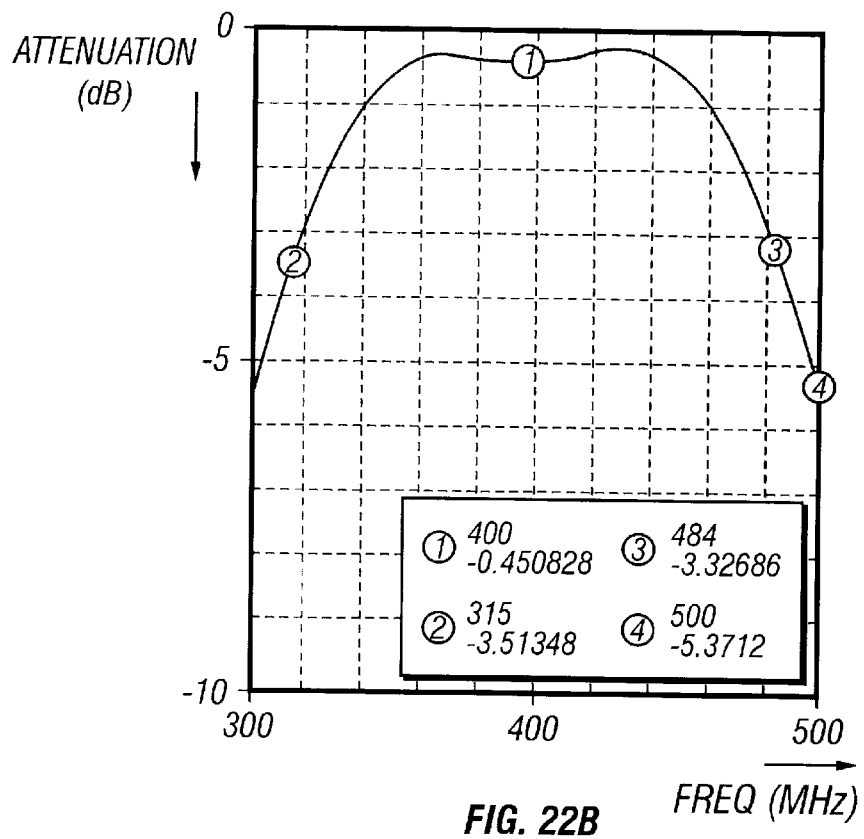
FIG. 22b is the simulated response for the resonator of FIG. 21 using a smaller scale for both frequency (10 MHz/div.) and attenuation (1 dB/div.).

An implementation for a wide band band-pass filter circuit having a center frequency of 400 MHz and using the topology of FIG. 10a (including the micro-strip transmission lines of the first preferred embodiment) is shown in FIG. 21. The circuit comprises a balanced input for the input resonator 432 and an unbalanced output for the output resonator 434 (or vice versa). This circuit can be used as a signal combiner or as a signal splitter within the pass-band frequency range. A simulated output response of the filter of FIG. 21 is illustrated in FIGS. 22a and 22b. The $Q_L$ for this circuit is about 2.4; the fractional bandwidth is about 42%.

Figure 3:
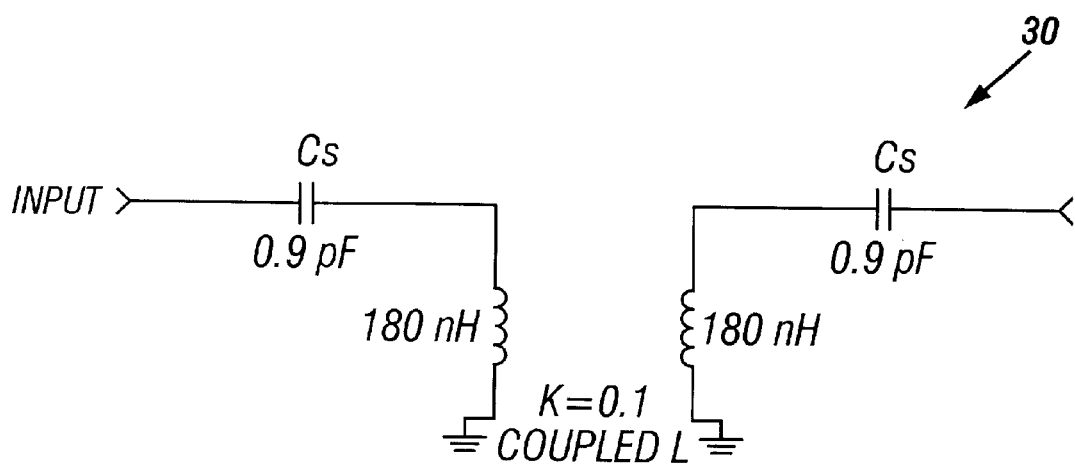
FIG. 3 is an example of the series resonator of FIG. 1a with extreme component values for known implementations of the resonator to achieve a maximum $Q_L$.
Figure 4A:
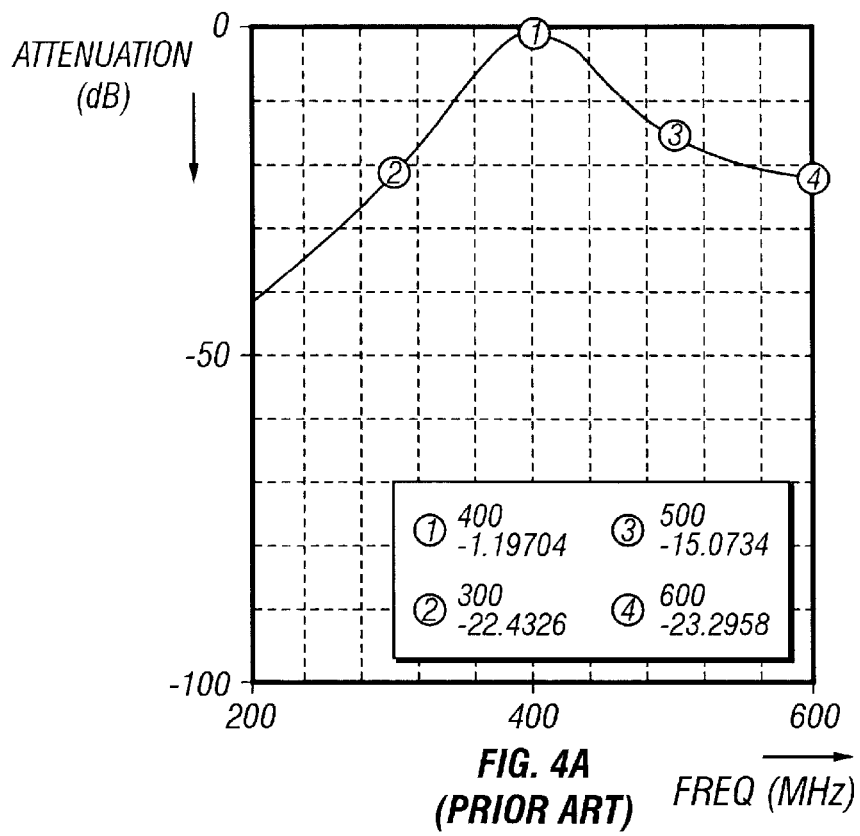
FIG. 4a is a simulated response for the prior art resonator of FIG. 3 using a broad scale for both frequency (40 MHz/div.) and attenuation (10 dB/div.).
Figure 4B:
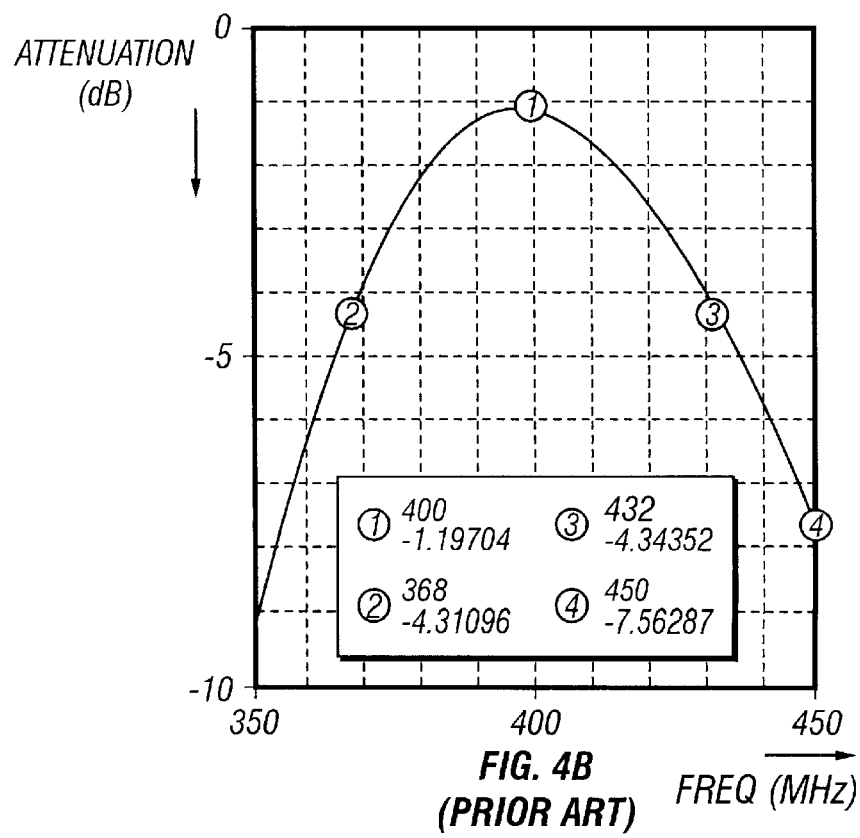
FIG. 4b is the simulated response for the prior art resonator of FIG. 3 using a smaller scale for both frequency (10 MHz/div.) and attenuation (1 dB/div.).
Figure 23:
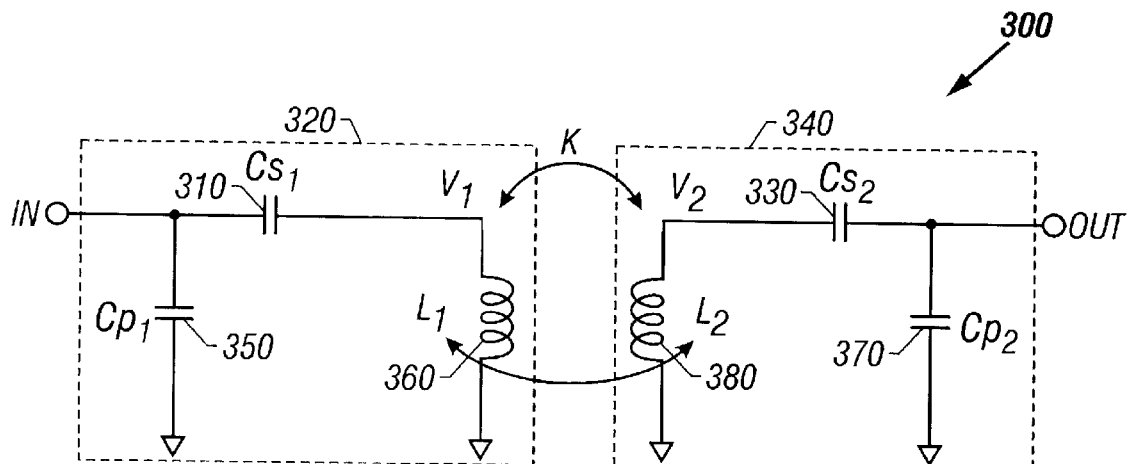
FIG. 23 is an illustration of a series tuned resonator using air coils as inductive elements, and having additional capacitors in parallel between the input and output signals and the resonators.

FIG. 23 illustrates a third preferred embodiment of the invention, wherein an additional capacitor ($C_{p1}$ 350 and $C_{p2}$ 370 respectively) is added in parallel with the series tuned input 320 and output 340 resonators of the prior art topology of FIG. 3. The values of $C_{p1}$ 350 and $C_{p2}$ 370 are very large relative to the values of the series capacitors $C_{s1}$ 11 and $C_{s2}$ 13 of FIG. 1a. While the addition of such parallel capacitors would likely be counterintuitive to one of ordinary skill in the art, the addition of $C_{p1}$ 350 and $C_{p2}$ 370 actually further improves the response of the band-pass filter of the prior art topology of FIGS. 1a and 3 significantly. This addition of two very inexpensive components alters the band-pass filter from a fourth-order filter to a sixth-order filter in the same way that the addition of series capacitors to the parallel tuned circuit of FIG. 1b and FIG. 5 did. The resulting transfer function for the implementation of the present invention with the modified topology of FIG. 23 is the basically the same as that for the topology of FIG. 10a disclosed above. This is because they are theoretical duels of each other.

Figure 24:
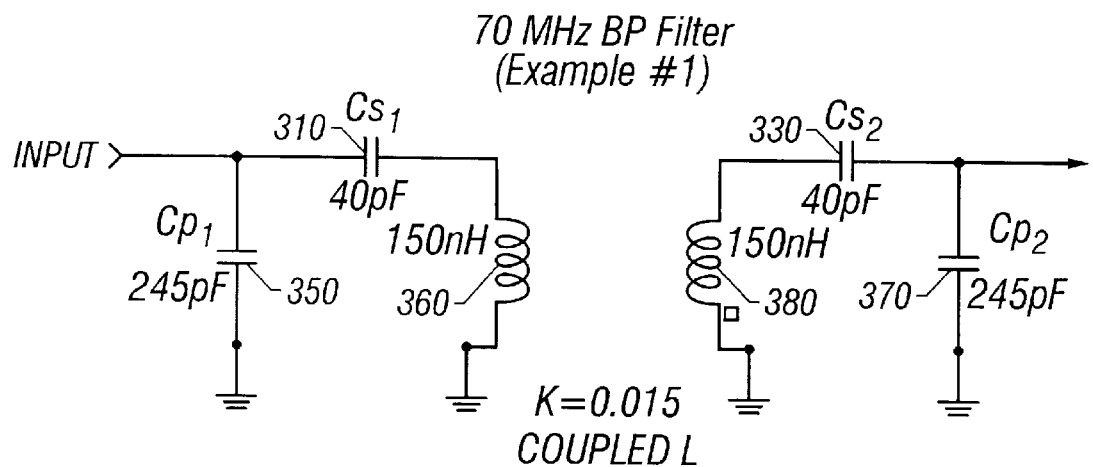
FIG. 24 is an illustration of an embodiment of the series tunes resonator of FIG. 23 having component values to achieve a 70 MHz narrow band-pass filter.
Figure 25A:
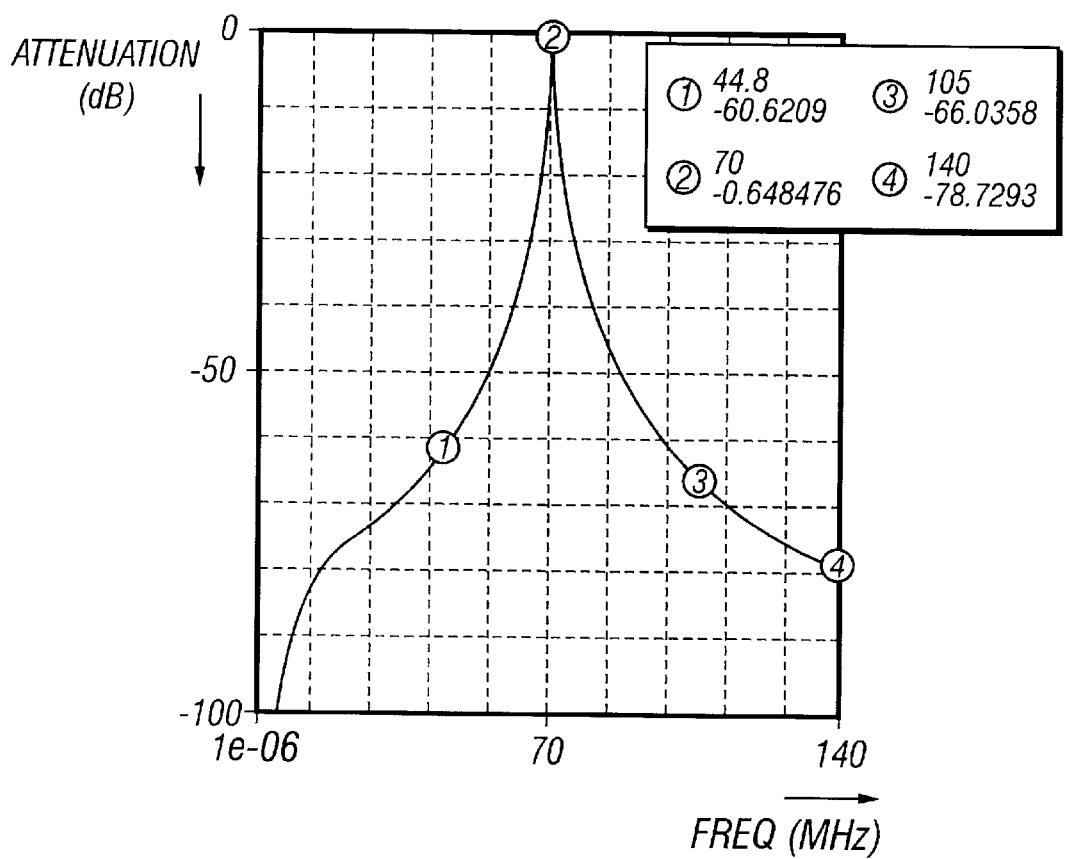
FIG. 25a is a simulated response for the resonator of FIG. 24 using a broad scale for both frequency (40 MHz/div.) and attenuation (10 dB/div.).
Figure 25B:
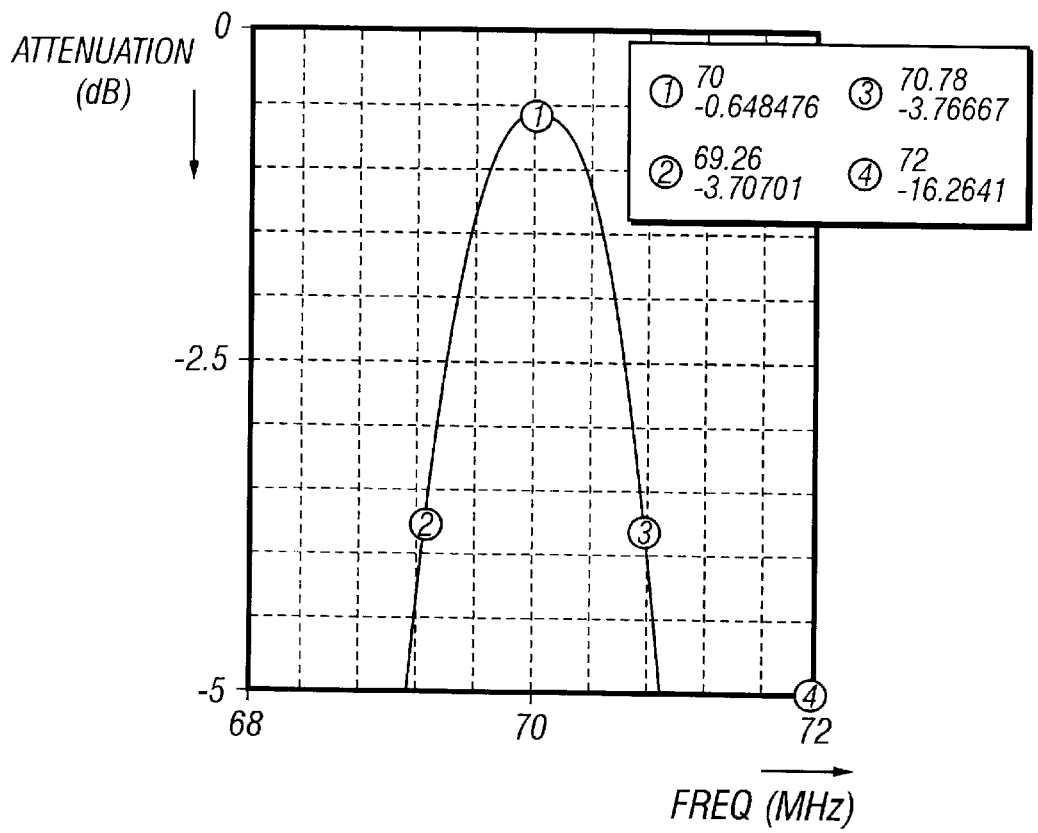
FIG. 25b is the simulated response for the resonator of FIG. 24 using a smaller scale for both frequency (10 MHz/div.) and attenuation (1 dB/div.).

An implementation for a band-pass circuit having a center frequency of 70 MHz and using the topology of FIG. 23 (using air coils for inductors to achieve the higher inductance values required for high $Q_L$) is shown in FIG. 24. A simulated output response of the filter of FIG. 24 is illustrated in FIGS. 25a and 25b. The $Q_L$ for this circuit is about 46; the fractional bandwidth is about 2.2%.

Figure 26:
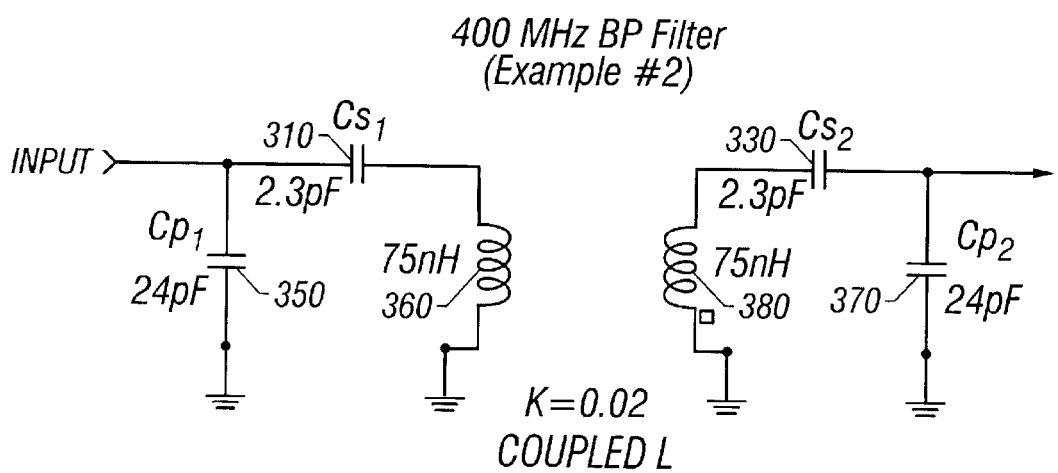
FIG. 26 is an illustration of an embodiment of the series tuned circuit of FIG. 23 with component values to achieve a 400 MHz narrow band-pass filter.
Figure 27A:
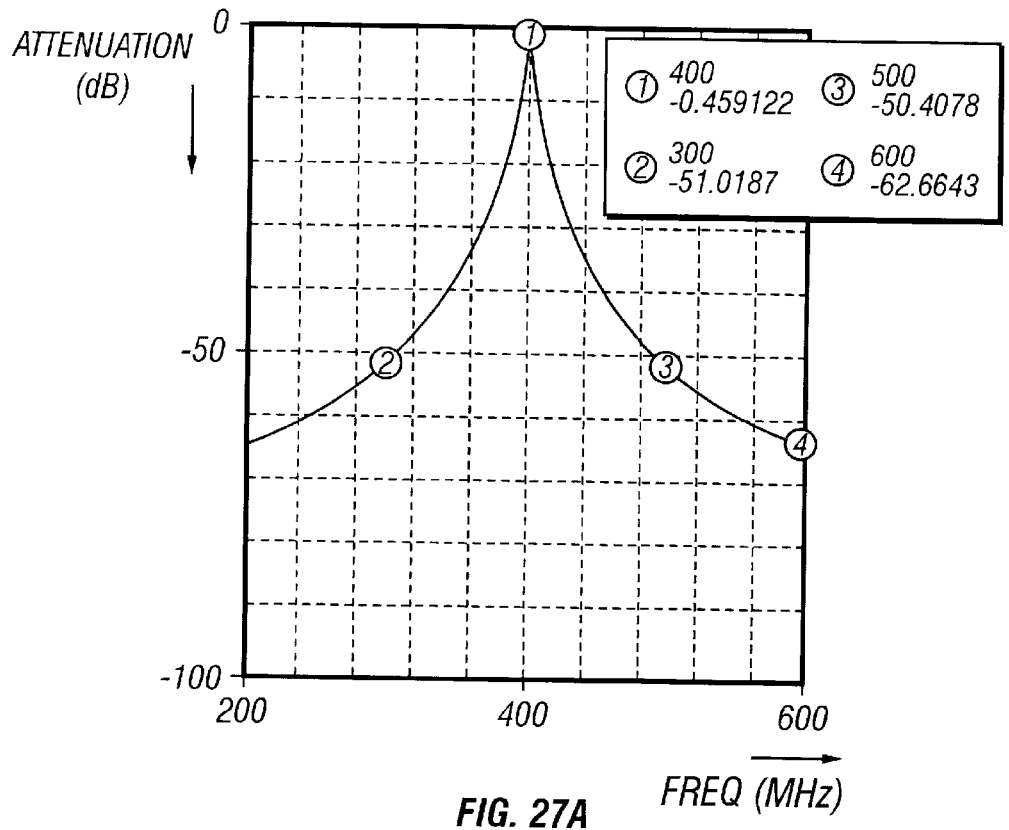
FIG. 27a is a simulated response for the resonator of FIG. 26 using a broad scale for both frequency (40 MHz/div.) and attenuation (10 dB/div.).
Figure 27B:
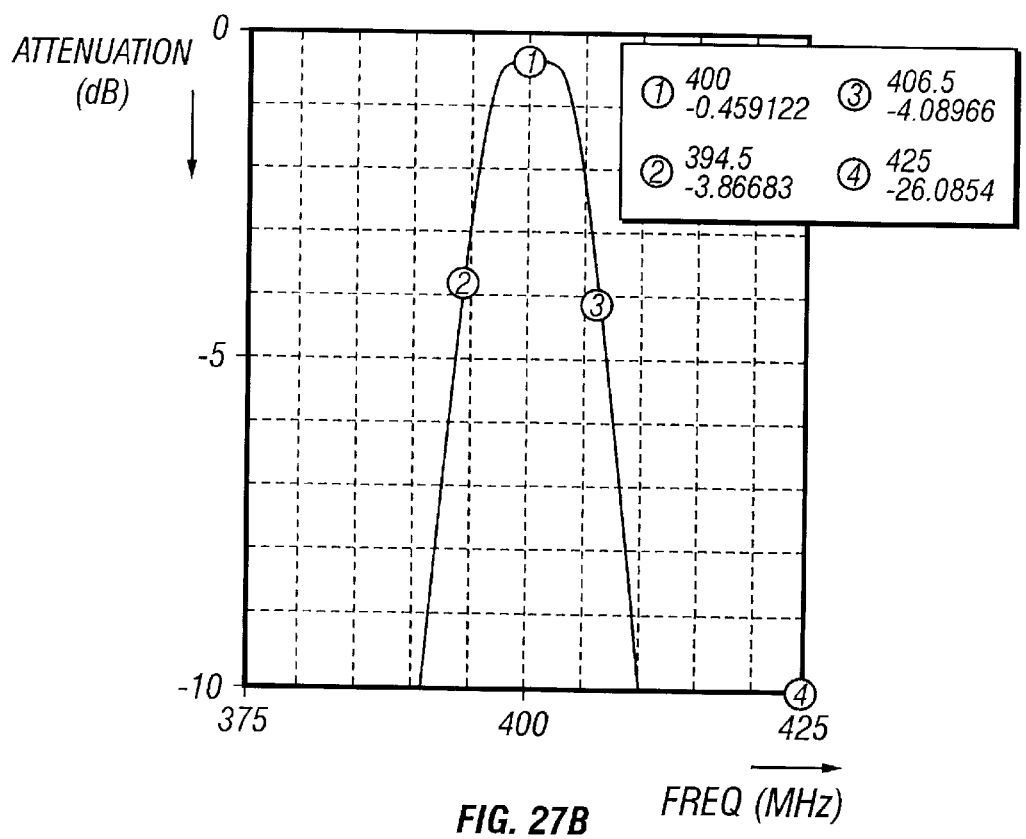
FIG. 27b is the simulated response for the resonator of FIG. 26 using a smaller scale for both frequency (10 MHz/div.) and attenuation (1 dB/div.).

An implementation for a band-pass circuit having a center frequency of 400 MHz and using the topology of FIG. 23 (using air coils for inductors to achieve the higher inductance values required for high $Q_L$) is shown in FIG. 26. A simulated output response of the filter of FIG. 26 is illustrated in FIGS. 27a and 27b. The $Q_L$ for this circuit is about 33.33; the fractional bandwidth is about 3%.

Figure 28:
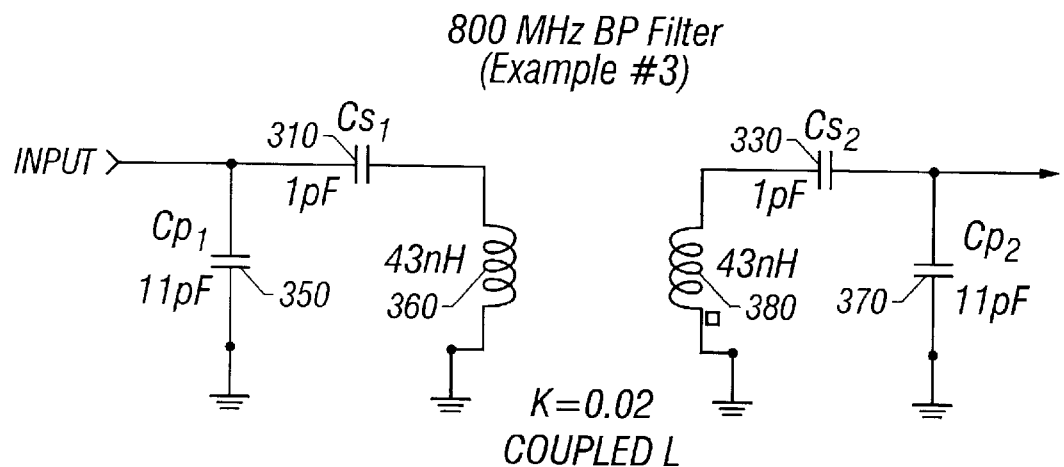
FIG. 28 is an illustration of an embodiment of the series tuned circuit of FIG. 23 with component values to achieve a 800 MHz narrow band-pass filter.
Figure 29A:
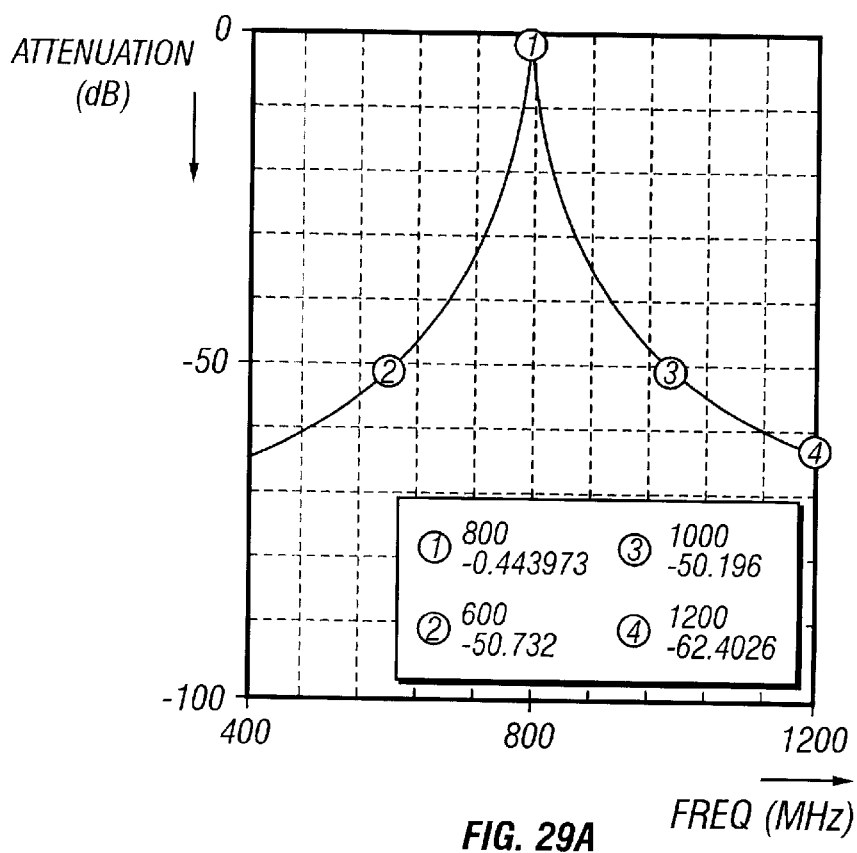
FIG. 29a is a simulated response for the resonator of FIG. 28 using a broad scale for both frequency (40 MHz/div.) and attenuation (10 dB/div.).
Figure 29B:
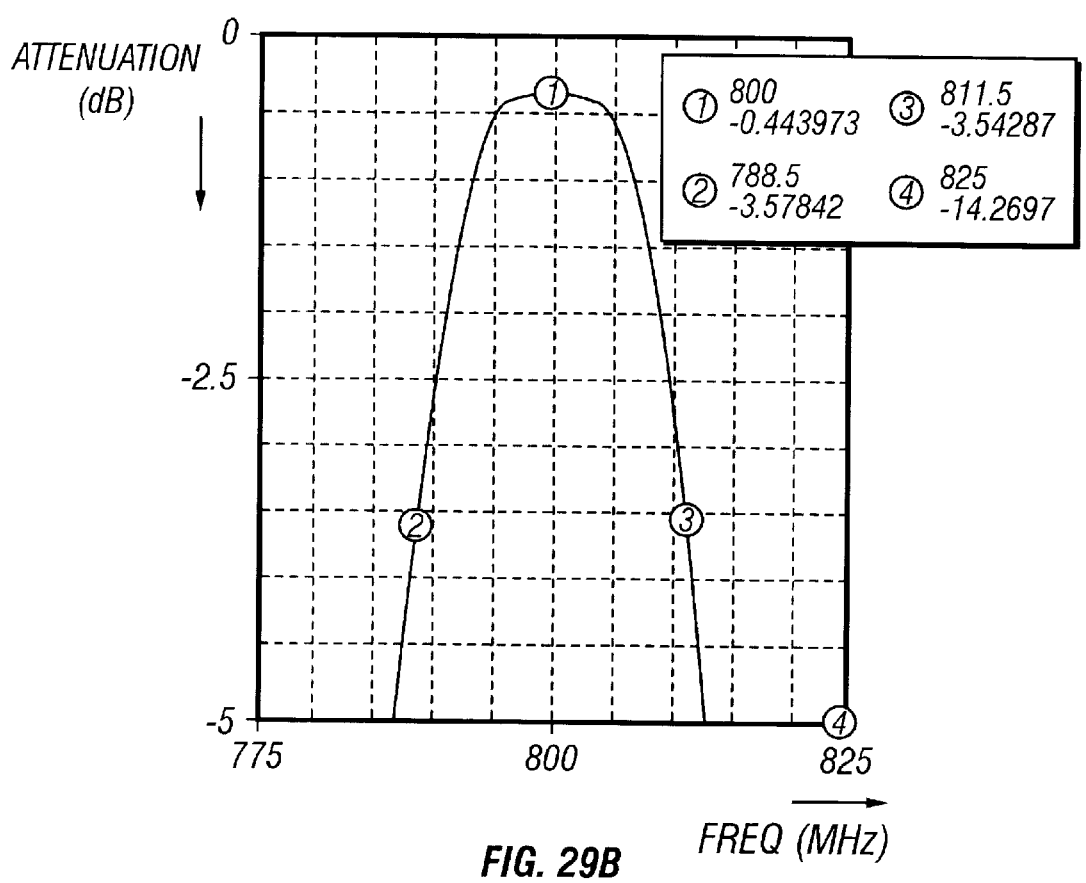
FIG. 29b is the simulated response for the resonator of FIG. 28 using a smaller scale for both frequency (10 MHz/div.) and attenuation (1 dB/div.).

An implementation for a band-pass circuit having a center frequency of 70 MHz and using the topology of FIG. 23 (using air coils for inductors to achieve the higher inductance values required for high $Q_L$) is shown in FIG. 28. A simulated output response of the filter of FIG. 28 is illustrated in FIGS. 29a and 29b. The $Q_L$ for this circuit is about 34.8; the fractional bandwidth is about 2.9%.

FIG. 30 is a table of values for the various examples of implementations of the parallel double-tuned topology employing the micro-strip lines for the inductor components of the circuit, including the dimensions and other pertinent information.

Figure 31:
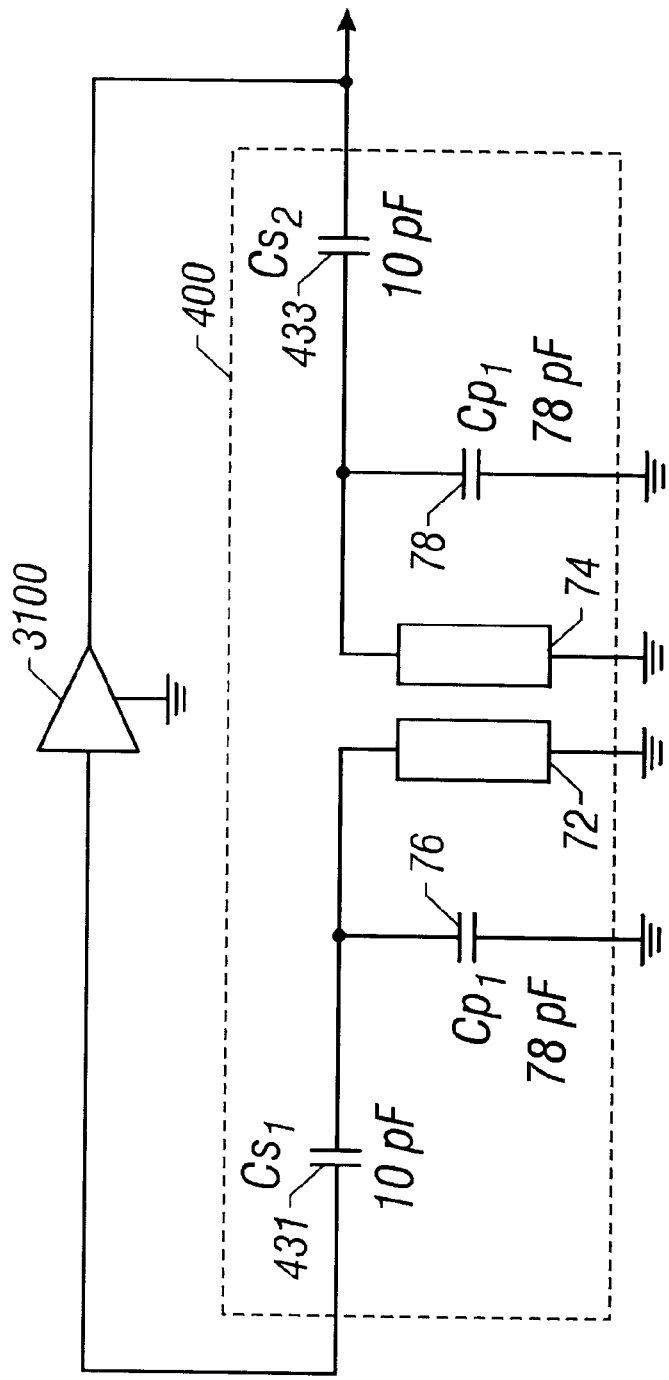
FIG. 31 is an example of an embodiment employing the parallel tuned resonator circuit of FIG. 10a to achieve a 400 MHz Oscillator.

In addition to filtering applications, the present invention can be utilized in different applications where its unique features, namely its frequency discrimination ability combined with low insertion loss, can provide significant advantages. An example of such application is the use of the present invention in the feedback path of oscillators, as shown in FIG. 31. Connecting the input/output ports of the coupled resonator filter 400 to the input/output ports of an RF amplifier 3100 will provide a feedback path from the output of the amplifier 3100 to its input, effectively closing the loop around the amplifier 3100. The oscillation will occur at the frequency where the phase shift around the loop is 0 degrees (or multiples of 360 degrees) provided that the loop gain is greater than one (i.e. the gain of the amplifier 3100 is greater than the insertion loss of the feedback path). The phase shift of the coupled resonators structure 400 is 180 degrees on center frequency, and using an inverting amplifier (with 180 degrees of internal phase shift) will provide a total phase shift of 360 degrees, thus meeting the conditions necessary for oscillation. A circuit utilizing coupled resonators with 0 degrees phase shift (for instance, by rotating the input 72 or output 74 micro-strip by 180 degrees relative to the other), followed by a non-inverting amplifier for amplifier 3100 will also meet the conditions for oscillation.

The narrow bandwidth of the magnetically coupled resonators (i.e. its high $Q_L$) is associated with steep phase slope in the vicinity of the center frequency. This steep phase slope in the feedback loop will improve the phase noise performance of the oscillator of FIG. 31.

What is claimed is:

1. A coupled resonator circuit comprising:
   a primary resonator magnetically coupled to a secondary resonator, said primary and secondary resonator each comprising:
   a circuit combination comprising a first capacitance connected to an inductance;
   a second capacitance connected to said circuit combination; and
   wherein said magnetic coupling between said primary and secondary resonators is characterized by a coupling coefficient k having a value substantially less than 1 while power transfer between said primary and secondary resonators remains high.

2. A resonator circuit comprising:
   a first resonator having a resonance frequency, said first resonator comprising:
   a circuit combination comprising a first capacitance connected in parallel with an inductance;
   a second capacitance connected in series with said circuit combination; and
   wherein said second capacitance has a value that is substantially smaller than the value of said first capacitance.

3. The resonator circuit of claim 2 fuirther comprising:
   a second resonator having a resonance frequency substantially equal to the resonance frequency of said first resonator, said second resonator comprising:
   a circuit combination comprising a first capacitance connected in parallel with an inductance;
   a second capacitance connected in series with said circuit combination; and
   wherein said first and said second resonators are magnetically coupled to one another.

4. The resonator circuit of claim 3 having a transfer function that is $6^{th}$ order in nature.

5. The resonator circuit of claim 3 wherein said magnetic coupling between said first and second resonators is characterized by a coupling coefficient k having a value substantially less than 1.

6. The resonator circuit of claim 2 wherein said inductance of said combinations is formed by a metal line residing on a substantially nonconductive surface.

7. The resonator circuit of claim 6 wherein said inductance is formed by two or more of said metal lines connected in parallel to one another.

8. A resonator circuit comprising:
   a first resonator having a resonance frequency, said first resonator further comprising:
   a circuit combination comprising a first capacitance connected in series with a single inductance;
   a second capacitance connected in parallel with said circuit combination; and
   wherein said second capacitance has a value that is substantially greater than the value of said first capacitance.

9. The resonator circuit of claim 8 further comprising;
   a second resonator having resonance frequency substantially equal to the resonance frequency of said first resonator, said second resonator comprising:
   a circuit combination comprising a first capacitance connected in series with a single inductance; and
   a second capacitance connected in parallel with said second combination; and
   wherein said first and said second resonators are magnetically coupled to one another.

10. The resonator circuit of claim 9 having a transfer function that is $6^{th}$ order in nature.

11. The resonator circuit of claim 9 wherein said magnetic coupling between said first and second resonators is characterized by a coupling coefficient k having a value substantially less than 1.

12. The resonator circuit of claim 8 wherein said inductance is implemented using air coils.

13. The resonator circuit of claim 11 wherein said coupling coefficient k is on the order of 0.02 or less.

14. The resonator circuit of claim 5 wherein said coupling coefficient k is on the order of 0.02 or less.

15. A coupled resonator circuit comprising a first resonator magnetically coupled to a second resonator, said first and second resonator each comprising a circuit combination, said circuit combination comprising a first capacitance connected in parallel to an inductance, said inductance formed by a plurality of metal lines connected in parallel with one another and residing on a substantially nonconductive surface.

16. The coupled resonator circuit of claim 15 further comprising a second capacitor connected in series with said first resonator, and a third capacitor connected in series with said second resonator to render the transfer function of said coupled resonator circuit $6^{th}$ order in nature.

17. The coupled resonator circuit of claim 15 wherein said magnetic coupling between said first and said second resonators is characterized by a coupling coefficient k having a value substantially less than 1.

18. The coupled resonator circuit of claim 17 wherein said coupling coefficient k is on the order of 0.02 or less.

* * * * *